(12) United States Patent
Tsukamoto et al.

(10) Patent No.: US 7,456,483 B2
(45) Date of Patent: Nov. 25, 2008

(54) SEMICONDUCTOR DEVICE, MANUFACTURING METHOD OF SEMICONDUCTOR DEVICE AND MODULE FOR OPTICAL DEVICE

(75) Inventors: Hiroaki Tsukamoto, Yamatotakada (JP); Kazuya Fujita, Nabari (JP); Takashi Yasudome, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 29 days.

(21) Appl. No.: 11/125,661

(22) Filed: May 9, 2005

(65) Prior Publication Data

US 2005/0247992 A1 Nov. 10, 2005

(30) Foreign Application Priority Data

May 10, 2004 (JP) .............................. 2004-140370

(51) Int. Cl.
H01L 29/72 (2006.01)
(52) U.S. Cl. ................... 257/433; 257/684; 257/704; 439/75; 439/90
(58) Field of Classification Search ................ 257/433, 257/684, 704; 439/75, 90
See application file for complete search history.

(56) References Cited

U.S. PATENT DOCUMENTS

| | | | |
|---|---|---|---|
| 5,206,097 A * | 4/1993 | Burns et al. ................... 429/90 |
| 5,369,057 A | 11/1994 | Lee et al. | |
| 2002/0057468 A1 | 5/2002 | Segawa et al. | |
| 2003/0025825 A1 | 2/2003 | Nakajoh | |
| 2003/0056392 A1 | 3/2003 | Boroson et al. | |
| 2004/0009683 A1 * | 1/2004 | Hiraoka et al. ................. 439/75 |
| 2004/0036069 A1 | 2/2004 | Barton et al. | |
| 2004/0145909 A1 * | 7/2004 | Ognian et al. ................ 362/516 |

FOREIGN PATENT DOCUMENTS

| | | |
|---|---|---|
| CN | 1433630 A | 7/2003 |
| EP | 1 239 519 | 9/2002 |
| JP | 58176968 | 10/1983 |
| JP | 3-151666 | 6/1991 |
| JP | 07-202152 | 8/1995 |
| JP | 2001-351997 | 12/2001 |
| JP | 2002-076154 | 3/2002 |
| JP | 2002-124589 | 4/2002 |
| JP | 2003-197656 | 7/2003 |
| JP | 2004-296453 | 10/2004 |

OTHER PUBLICATIONS

Certification.

* cited by examiner

*Primary Examiner*—Edward Wojciechowicz
(74) *Attorney, Agent, or Firm*—Edwards Angell Palmer & Dodge LLP; David G. Conlin; William J. Daley, Jr.

(57) ABSTRACT

A bond portion for bonding the principal plane of a solid-state imaging element with a transparent covering portion and configuring a hollow portion therebetween is provided with: a first opening end portion on the hollow portion side; a second opening end portion on the outer side; and a trap portion. The first opening end portion, the trap portion and the second opening end portion constitute a vent path. The vent path is shaped not to connect the first opening end portion with the second opening end portion linearly but to connect the opening end portions in the bond portion via the trap portion larger than the opening end portions.

17 Claims, 15 Drawing Sheets

SEMICONDUCTOR DEVICE, MANUFACTURING METHOD OF SEMICONDUCTOR DEVICE AND MODULE FOR OPTICAL DEVICE

CROSS-REFERENCE TO RELATED APPLICATIONS

This Nonprovisional application claims priority under 35 U. S. C. §119(a) on patent application No. 2004-140370 filed in Japan on May 10, 2004, the entire contents of which are hereby incorporated by reference.

BACKGROUND OF THE INVENTION

1. Field of the Invention

The present invention relates to: a semiconductor device having a sealing function added to a vent path provided at a covering body for covering a semiconductor element; a manufacturing method of the semiconductor device; and a module for an optical device which uses the semiconductor device.

2. Description of Related Art

A conventional photo acceptance semiconductor device, such as a CCD (Charge Coupled Device) image sensor and a CMOS (Complementary Metal Oxide Semiconductor) image sensor, for converting an optical signal into an electric signal has a semiconductor element or the like packaged and sealed in a hollow package made of ceramics, plastics or the like, in order to prevent moisture, contaminant and the like from entering the semiconductor element from the outside.

FIG. 1 is a sectional view showing the schematic structure of a solid-state imaging device as an example of a conventional photo acceptance semiconductor device. The solid-state imaging device shown in FIG. 1 comprises a hollow package having a hollow portion (space) formed between a base 50 provided with a recess 52 formed at a substantially center portion thereof and a transparent covering portion 4 attached via a frame 53 on the base 50, and a solid-state imaging element 2 is arranged at this hollow portion. At the base 50 made of ceramics, plastics or the like, the solid-state imaging element 2 is laid in the recess 52 and a lead member 51 which extends from a peripheral portion of the base 50 toward the outside is attached. The lead member 51 made of 42-alloy, copper or the like and the solid-state imaging element 2 are electrically connected via bonding wire 2w.

The frame 53 having a predetermined height is attached immediately above the lead member 51 and the covering portion 4 made of glass or the like is implanted in a notch portion of this frame 53. Adhesive 54 is used for bonding the frame 53 with the covering portion 4 to seal the hollow portion between the base 50 and the covering portion 4. By sealing the hollow portion between the base 50 and the covering portion 4, the structure prevents moisture, contaminant and the like from entering the solid-state imaging element 2 from the outside. Furthermore, the adhesive 54 is filled in the hollow portion so as not to block an optical path between an effective pixel area 3 and the covering portion 4.

Moreover, in a conventional manufacturing method of a solid-state imaging device shown in FIG. 1, a plurality of solid-state imaging elements 2 which are formed simultaneously on a semiconductor wafer are divided and dissected out with a dicing saw or the like, a dissected-out solid-state imaging element 2 is laid on the base 50 and then the covering portion 4 is placed so as to cover the entire solid-state imaging element 2, or even including other portion.

Regarding the package form of the solid-state imaging device shown in FIG. 1, however, it is necessary to select the adhesive 54 and the material and the form of the frame 53 and the base 50 to prevent moisture from entering the inside of the solid-state imaging device (hollow portion) as much as possible in order to prevent humidity deterioration of the solid-state imaging element 2 and dew formation on the inner surface of the covering portion 4, and air in a sealed portion expands or the like causing generation of air bubble or an air path between the covering portion 4 and the adhesive 54 while covering the effective pixel area 3 of the solid-state imaging element 2 with the covering portion 4. Accordingly, the adhesive 54 and the material and the form of the frame 53 and the base 50 are limited to a particular kind and, therefore, the package becomes extremely expensive and, therefore, a solid-state imaging device comprising the package also becomes expensive.

Consequently, disclosed in Japanese Patent Application Laid-Open No. 2002-124589 is a semiconductor device in which a semiconductor element is sealed in a hollow package having an air-permeable portion, so as to prevent dew formation by conforming the environment in the semiconductor device to outside air instead. FIGS. 2A and 2B are explanatory views showing the structure of a conventional semiconductor device disclosed in Japanese Patent Application Laid-Open No. 2002-124589 and, in particular, FIG. 2A shows a plan view and FIG. 2B shows a sectional view along the line B-B in FIG. 2A.

In the semiconductor device shown in FIGS. 2A and 2B, a hollow package, or a package body 55, which is made of resin, ceramics or the like and has a plurality of lead members 51 extending from and formed integrally with the package is provided, a semiconductor element, e.g. a solid-state imaging element such as a CCD or a semiconductor chip 56 such as a semiconductor laser element, is arranged inside the package body 55, metal wire (for example, gold Au wire) 57 connects an inner lead portion 51a of the lead member 51 with an electrode of the semiconductor chip 56, an opening portion of the package body 55 on the photo acceptance side is sealed with a sealing glass member, or a transparent glass plate 58, via the adhesive 54 and a hollow package 59 is composed of the glass plate 58 and the package body 55 constructed to provide this sealing portion with air permeability.

For providing an air-permeable structure, a portion which is not coated with the adhesive 54 is provided deliberately at a part of a bond portion of the package body 55 and the glass plate 58. This uncoated portion configures an air-permeable vent path 70, and air communication between the inside of the package 59 and the outside is realized through the vent path 70.

In the semiconductor device disclosed in the Japanese Patent Application Laid-Open No. 2002-124589 which has a simple linear vent portion, however, problems may occur.

That is, since the vent path 70 provided at the semiconductor device disclosed in Japanese Patent Application Laid-Open No. 2002-124589 has a simple linear form, i.e. a form extending linearly, water may enter the device through the vent path 70 in a washing step, foreign matter may enter the device together with the water, the foreign matter may attach as dust to the surface of the principal plane of the semiconductor chip 56 and scars may be generated on the surface of the principal plane of the semiconductor chip 56.

BRIEF SUMMARY OF THE INVENTION

The present invention has been made with the aim of solving the above problems, and it is an object thereof to provide a semiconductor device capable of preventing humidity deterioration of a semiconductor element and dew formation on the inner surface of a covering body in the use environment, preventing water and foreign matter from entering a hollow portion in manufacturing steps, especially steps after a dicing step (dicing step, washing step, drying step and the like), preventing attachment of water and foreign matter and generation of scars on the surface of the principal plane of the conductor element and making it possible to select the material of the covering body flexibly, by providing a hollow portion and providing an impermeable vent path at a covering body for covering a semiconductor element.

Another object of the present invention is to provide a semiconductor device capable of forming a vent path easily and with a high degree of accuracy and making it possible to select the material of a covering portion and a bond portion flexibly, by constituting a covering body with a covering portion and a bond portion and providing a vent path at the bond portion.

Another object of the present invention is to provide a semiconductor device capable of preventing water and foreign matter from entering a hollow portion in manufacturing steps after a dicing step and preventing attachment of foreign matter and generation of scars on the surface of the principal plane of a semiconductor element, by providing a trap portion for trapping water in a vent path.

Another object of the present invention is to provide a semiconductor device capable of further enhancing the protection effectiveness against entering of water and foreign matter into the hollow portion after the dicing step and further enhancing the protection effectiveness against attachment of foreign matter and generation of scars on the surface of the principal plane of the semiconductor element, by forming the vent path in a complicated form.

Another object of the present invention is to provide a semiconductor device capable of enhancing the protection effectiveness against entering of water and foreign matter into the trap portion after the dicing step, by making the covering portion rectangular and shaping a second opening end portion provided on the outer side of the vent path to be inclined with respect to an edge of the covering portion or to be inclined at an acute angle with respect to a semiconductor wafer movement direction for cutting a semiconductor element from a semiconductor wafer.

Another object of the present invention is to provide a semiconductor device capable of realizing simple layout designing of a bond portion and securing a trap portion sufficiently, by forming the bond portion in the form of a rectangular ring and forming a vent path along at least an edge of a bond portion.

Another object of the present invention is to provide a semiconductor device capable of dealing with optical signals, by making the covering body/covering portion transparent and providing a photo acceptance element area at the semiconductor element.

Another object of the present invention is to provide: a semiconductor device capable of miniaturizing the device by making the covering portion smaller than the semiconductor element; and a manufacturing method of the semiconductor device.

Another object of the present invention is to provide a semiconductor device and a manufacturing method of the semiconductor device capable of forming a bond portion having a vent portion, which has an accurate form and is aligned with a high degree of accuracy, provided with a sealing function which is a feature of the present invention, by putting photosensitive adhesive into the bond portion.

Moreover, another object of the present invention is to provide a manufacturing method of a semiconductor device capable of reducing failure due to attachment of foreign matter, generation of scars and the like on the surface of the principal plane of a semiconductor element, especially failure in a dicing step, and enhancing the production efficiency, by bonding the plate material/covering portion with a semiconductor element to be opposed each other so as to protect a plurality of semiconductor elements formed on a semiconductor wafer.

Another object of the present invention is to provide a manufacturing method of a semiconductor device capable of forming a plurality of covering portions having less dust, by attaching a bond portion provided with a plurality of vent paths with dicing tape and dividing a plate material.

Moreover, another object of the present invention is to provide a manufacturing method of a semiconductor device capable of simplifying a step of bonding a covering portion and enhancing the production efficiency of the device, by forming the covering portion using a plate material.

Furthermore, another object of the present invention is to provide a reliable module for an optical device capable of realizing easy miniaturization and high portability, by incorporating a semiconductor device of the present invention therein.

A semiconductor device according to the present invention is a semiconductor device having a hollow portion between a semiconductor element and a covering body for covering the semiconductor element, the covering body being provided with a vent path extending from the hollow portion to the outside, characterized in that the vent path is impermeable.

A semiconductor device according to the present invention is characterized in that the covering body is composed of a covering portion for covering the semiconductor element and a bond portion for bonding the semiconductor element with the covering portion, and the vent path is formed at the bond portion.

A semiconductor device according to the present invention is characterized in that the vent path has: a first opening end portion provided on the hollow portion side; a second opening end portion provided at the outer side; and a trap portion, which is formed between the first opening end portion and the second opening end portion to be larger than the first opening end portion and the second opening end portion, for trapping water.

A semiconductor device according to the present invention is characterized in that the trap portion has a partition wall.

A semiconductor device according to the present invention is characterized in that the vent path is nonlinear.

A semiconductor device according to the present invention is characterized in that the covering portion is rectangular and the second opening end portion is inclined with respect to an edge of the covering portion.

A semiconductor device according to the present invention is characterized in that the second opening end portion is formed to be inclined at an acute angle with respect to a semiconductor wafer movement direction for cutting a semiconductor element from a semiconductor wafer.

A semiconductor device according to the present invention is characterized in that the second opening end portion has a projection wall which is projected to the trap portion.

A semiconductor device according to the present invention is characterized in that the first opening end portion has a projection wall which is projected to the trap portion.

A semiconductor device according to the present invention is characterized in that the bond portion is formed in the form of a rectangular ring and the vent path is formed along at least one edge of the bond portion.

A semiconductor device according to the present invention is characterized in that the covering body is transparent and the semiconductor element has a photo acceptance element area provided with a plurality of arranged photo acceptance elements for converting light transmitted through the covering body into an electric signal.

A semiconductor device according to the present invention is characterized in that the covering portion is transparent, the semiconductor element has a photo acceptance element area provided with a plurality of arranged photo acceptance elements for converting light transmitted through the covering portion into an electric signal and the bond portion is formed at an area which does not block an optical path between the covering portion and the photo acceptance element area.

A semiconductor device according to the present invention is characterized in that the covering portion is smaller than the semiconductor element.

A semiconductor device according to the present invention is characterized in that the bond portion includes photosensitive adhesive.

A manufacturing method of a semiconductor device according to the present invention is a method for manufacturing a semiconductor device which has a semiconductor element, a covering portion for covering the semiconductor element and a hollow portion formed between the semiconductor element and the covering portion, the semiconductor element and the covering portion being bonded, characterized by including: a step of forming a plurality of semiconductor elements on a semiconductor wafer; a step of forming a bond portion at a plate material; a step of forming a plurality of impermeable vent paths at the bond portion; a step of dividing the plate material provided with the plurality of vent paths formed at the bond portion to form a plurality of covering portions; a step of bonding the covering portions respectively with the plurality of semiconductor elements to be opposed each other; and a step of dividing the plurality of semiconductor elements bonded with the covering portions into separate semiconductor elements.

A manufacturing method of a semiconductor device according to the present invention is characterized in that the step of dividing the plate material is achieved by attaching the bond portion provided with the plurality of vent paths to dicing tape and then dividing the plate material to form a plurality of covering portions, and the step of bonding the covering portions is achieved by releasing the dicing tape from the bond portion and then bonding the covering portions respectively with the plurality of semiconductor elements to be opposed each other.

A manufacturing method of a semiconductor device according to the present invention is a method for manufacturing a semiconductor device which has a semiconductor element, a covering portion for covering the semiconductor element and a hollow portion formed between the semiconductor element and the covering portion, the semiconductor element and the covering portion being bonded, characterized by including: a step of forming a plurality of semiconductor elements on a semiconductor wafer; a step of forming a bond portion at the plurality of semiconductor elements; a step of forming an impermeable vent path at the bond portion corresponding to each of the plurality of semiconductor elements; a step of bonding the covering portion with each of the plurality of semiconductor elements to be opposed each other; and a step of dividing the plurality of semiconductor elements bonded with the covering portion into separate semiconductor elements.

A manufacturing method of a semiconductor device according to the present invention is a method for manufacturing a semiconductor device which has a semiconductor element, a covering portion for covering the semiconductor element and a hollow portion formed between the semiconductor element and the covering portion, the semiconductor element and the covering portion being bonded, characterized by including: a step of forming a plurality of semiconductor elements on a semiconductor wafer; a step of forming a bond portion at the plurality of semiconductor elements; a step of forming an impermeable vent path at the bond portion corresponding to each of the plurality of semiconductor elements; a step of bonding a plate material with the plurality of semiconductor elements; a step of dividing the plate material to form a covering portion corresponding to each of the plurality of semiconductor elements; and a step of dividing the plurality of semiconductor elements provided with the covering portion into separate semiconductor elements.

A manufacturing method of a semiconductor device according to the present invention is a method for manufacturing a semiconductor device which has a semiconductor element, a covering portion for covering the semiconductor element and a hollow portion formed between the semiconductor element and the covering portion, the semiconductor element and the covering portion being bonded, characterized by including: a step of forming a plurality of semiconductor elements on a semiconductor wafer; a step of forming a bond portion at a plate material; a step of forming a plurality of impermeable vent paths at the bond portion; a step of bonding the plate material provided with the plurality of vent paths formed at the bond portion with the plurality of semiconductor elements; a step of dividing the plate material to form a covering portion corresponding to each of the plurality of semiconductor elements; and a step of dividing the plurality of semiconductor elements provided with the covering portion into separate semiconductor elements.

A manufacturing method of a semiconductor device according to the present invention is characterized in that the covering portion is smaller than each semiconductor element.

A manufacturing method of a semiconductor device according to the present invention is characterized in that the bond portion includes photosensitive adhesive.

A module for an optical device according to the present invention is characterized by comprising: a lens; a cylinder for holding the lens; and a semiconductor device according to the present invention, wherein the covering body of the semiconductor device is arranged inside the cylinder to be opposed to the lens.

A module for an optical device according to the present invention is characterized by comprising: a lens; a cylinder for holding the lens; and a semiconductor device according to the present invention, wherein the covering portion of the semiconductor device is arranged inside the cylinder to be opposed to the lens.

In a semiconductor device according to the present invention, ventilation and sealing between the hollow portion formed between the semiconductor element and the covering body and the outside are achieved by the vent path. Accordingly, when moisture enters the hollow portion from the outside or when moisture is generated at the hollow portion in the use environment, moisture is discharged through the vent path to the outside and humidity deterioration of the semiconductor element and dew formation on the inner surface of the covering body are prevented. On the other hand, in manufacturing steps, especially steps after the dicing step (dicing step, washing step, drying step and the like), entering of water into the hollow portion is prevented and entering of foreign matter such as swarf into the hollow portion together with this water is also prevented. Accordingly, attachment of foreign matter and generation of scars on the surface of the principal plane of the semiconductor element is prevented.

Accordingly, it is needless to limit the material of the covering body to a special material which secures air permeability between the hollow portion and the outside while preventing water and foreign matter from entering the hollow portion from the outside, and the probability of material selection is expanded.

In a semiconductor device according to the present invention, a vent path is formed at a bond portion for bonding a semiconductor element with a covering portion by, for example, pattern formation (patterning). Accordingly, formation of a vent path is facilitated. Moreover, when the covering portion is formed using a flat plate (plate material), the height of the hollow portion is changed easily by changing the height of the bond portion since the height of the bond portion is the same as the height of the hollow portion, that is, since a hollow structure is secured by the bond portion.

In addition, since the protection effectiveness mentioned above is obtained by the bond portion, it is needless to limit the material of the bond portion, i.e. the adhesive, as well as the material of the covering portion to a special material which secures air permeability between the hollow portion and the outside while preventing water and foreign matter from entering the hollow portion from the outside, and the probability of material selection is expanded.

In a semiconductor device according to the present invention, the first opening end portion and the second opening end portion of the vent path are respectively aligned on the hollow portion side and the outer side of the bond portion and the trap portion for trapping water exists between the first opening end portion and the second opening end portion of the vent path. Accordingly, when water and foreign matter enters the device from the outside through the second opening end portion in a manufacturing step after the dicing step, the water and the foreign matter are trapped (kept) at the trap portion. Moreover, since the trap portion has a form larger than that of the first opening end portion, the water and the foreign matter trapped at the trap portion is prevented from entering the hollow portion through the first opening end portion. Accordingly, attachment of foreign matter and generation of scars on the surface of the principal plane of the semiconductor element are prevented.

In a semiconductor device according to the present invention, since the trap portion has a partition wall, the vent path is nonlinear, the second opening end portion has a projection wall which is projected to the trap portion or the first opening end portion has a projection wall which is projected to the trap portion, the vent path does not have a linearly extending form like the semiconductor device disclosed in Japanese Patent Application Laid-Open No. 2002-124589 but has a complicated form, and the communication path between the first opening end portion and the second opening end portion do not have the shortest length.

Accordingly, since the probability of arrival of water and foreign matter, which are once trapped at the trap portion, at the first opening end portion after moving sequentially through the vent path is lowered (since water and foreign matter has to move snaking before arriving at the first opening end portion, in other words) and the probability of entering into the hollow portion is lowered, the protection effectiveness against entering of water and foreign matter into the hollow portion after the dicing step is further enhanced. Accordingly, the protection effectiveness against attachment of foreign matter and generation of scars on the surface of the principal plane of the semiconductor element is further enhanced.

When a projection wall is provided at the second opening end portion, since the path length of the second opening end portion is elongated by the length of the projection wall and the probability of entering of water and foreign matter from the outside through the second opening end portion into the trap portion is further lowered, the protection effectiveness against entering of water and foreign matter into the trap portion after the dicing step is further enhanced.

Similarly, when a projection wall is further provided at the first opening end portion, since the path length of the first opening end portion is elongated by the length of the projection wall, the probability of arrival of water and foreign mater trapped at the trap portion at the first opening end portion after moving through the vent path is lowered and the probability of entering of water and foreign matter from the trap portion through the first opening end portion into the hollow portion is lowered, the protection effectiveness against entering of water and foreign matter into the hollow portion after the dicing step is further enhanced. Accordingly, the protection effectiveness against attachment of foreign matter and generation of scars on the surface of the principal plane of the semiconductor element is further enhanced.

In a semiconductor device according to the present invention, since the covering portion is rectangular and the second opening end portion is shaped to be inclined with respect to an edge of the covering portion, the probability of entering of water and foreign matter from the outside through the second opening end portion into the trap portion is lowered in comparison with a case where the second opening end portion is provided, for example, perpendicular to an edge of the covering portion and, therefore, the protection effectiveness against entering of water and foreign matter into the trap portion after the dicing step is enhanced. Especially, when the second opening end portion is shaped to be inclined at an acute angle with respect to an semiconductor wafer movement direction relative to a dicing saw for cutting the semiconductor element from the semiconductor wafer, the protection effectiveness against entering of water and foreign matter into the trap portion after the dicing step is enhanced.

In a semiconductor device according to the present invention, since the bond portion is formed in the form of a rectangular ring, the layout design of the bond portion is simplified. Moreover, having a form similar to a plurality of rectangular semiconductor elements formed on the semiconductor wafer for integration, the bond portion does not function as a block with respect to the principal plane of the semiconductor element.

Moreover, since the vent path is formed along at least one edge of the bond portion, the trap portion is secured sufficiently. In this case, though the vent path may be formed separately at only one edge, two edges, three edges or all the edges or formed over a plurality of edges, it is the best embodiment to form the vent path at only one edge of the bond portion for miniaturization of the device since the width of the edge of the bond portion at which the vent path is formed is required to be larger than the width of a case where no vent path is formed.

In a semiconductor device according to the present invention, since the covering body or the covering portion is transparent and a photo acceptance element area is provided at the semiconductor element, it is enabled to apply the device as a device for dealing with optical signals such as a CCD image sensor or a CMOS image sensor. Moreover, since the bond portion is formed at an area which does not block the optical path between the covering portion and the photo acceptance element area, the photo acceptance efficiency of optical signals is not reduced.

In a semiconductor device and a manufacturing method of a semiconductor device according to the present invention, since the covering portion is smaller than the semiconductor element, the total volume of the semiconductor device is reduced and miniaturization of the semiconductor device is realized.

In a semiconductor device and a manufacturing method of a semiconductor device according to the present invention, since the bond portion for bonding the semiconductor element with the covering portion includes photosensitive adhesive, formed is a bond portion having a vent portion, which has an accurate form and is aligned with a high degree of accuracy, provided with a sealing function which is a feature of the present invention by applying a photolithographic technique. Moreover, a plurality of such bond portions having high pattern accuracy are formed at one time.

In a manufacturing method of a semiconductor device according to the present invention, since a plurality of semiconductor elements formed on a semiconductor wafer are protected by bonding a plate material/covering portion with the semiconductor elements to be opposed each other, failure due to attachment of foreign matter, generation of scars and the like on the surface of the principal plane of the semiconductor element, especially failure in the dicing step, is reduced.

It should be noted that, when a plate material provided with a plurality of vent portions formed at the bond portion is divided to form (configure) a plurality of covering portions, a number of covering portions are formed effectively while eliminating space waste between adjacent bond portions, that is, waste at cutting allowance portion of the plate material by increasing patterning density of the vent portion on the plate material, and the production cost is reduced.

Moreover, when a plate material is divided to form a covering portion for each of a plurality of semiconductor elements after bonding a plurality of semiconductor elements with the plate material, bonding of a covering portion with each of a plurality of semiconductor elements is performed simultaneously using one plate material. That is, since it is needless to align the covering portion (plate material) with a high degree of accuracy in comparison with a case where a covering portion is bonded with each semiconductor element, the step is simplified and the production efficiency is enhanced.

Moreover, when a covering portion is provided separately for a plurality of semiconductor elements, the production efficiency is enhanced by omitting bonding of a covering portion with a semiconductor element which is preliminarily condemned, and the production cost is reduced.

Moreover, since the covering portion (plate material) is bonded via a bond portion having a vent portion formed at a plurality of semiconductor elements in semiconductor wafer state or via a bond portion having a vent portion formed on the plate material, a bond portion having a vent portion at a plurality of semiconductor elements or at a plurality of covering portions can be formed simultaneously and the production efficiency is enhanced.

In a manufacturing method of a semiconductor device according to the present invention, since the bond portion provided with a plurality of vent paths is attached to dicing tape and the plate material is divided, a plurality of covering portions having a bond portion having less dust are formed.

In a manufacturing method of a semiconductor device according to the present invention, since the covering portion is formed using a plate material, a covering portion is formed separately for a plurality of semiconductor elements formed on each semiconductor wafer at one time, using one plate material. Accordingly, the step of bonding the covering portion is simplified and the production efficiency of the semiconductor device is enhanced.

In a module for an optical device according to the present invention, since a semiconductor device according to the present invention is incorporated, miniaturization and high portability are be realized and high reliability is provided.

With the present invention, since a sealing function is added to the vent path which is provided at the covering body and extends from the hollow portion provided therein to the outside, humidity deterioration of the semiconductor element and dew formation on the inner surface of the covering portion can be prevented in the use environment while, in manufacturing steps, especially steps after the dicing step (dicing step, washing step, drying step and the like), entering of water and foreign matter such as swarf together with this water into the hollow portion can be prevented. Accordingly, attachment of water and foreign matter and generation of scars on the surface of the principal plane of the semiconductor element can be prevented. Furthermore, since such protection effectiveness is obtained, it is possible to select the material of the covering body flexibly.

Moreover, with the present invention, a vent path can be formed at a bond portion for bonding a semiconductor element with a covering portion by, for example, pattern formation (patterning) and the vent path can be formed easily and with a high degree of accuracy. In addition, when the covering portion is formed using a flat plate (plate material), the height of the hollow portion can be changed easily by changing the height of the bond portion since the height of the bond portion is the same as the height of the hollow portion, that is, since a hollow structure can be secured by the bond portion. Moreover, since the protection effectiveness mentioned above can be obtained by the bond portion, it is possible to select the material of the bond portion (adhesive) as well as the material of the covering portion flexibly.

Moreover, with the present invention, since the vent path has a trap portion for trapping water, water can be trapped at the trap portion even when water and foreign matter together with the water enter the device after the dicing step. Accordingly, it is possible to prevent the water and the foreign matter from entering the hollow portion conclusively and, therefore, attachment of foreign matter and generation of scars on the surface of the principal plane of the semiconductor element can be prevented.

Moreover, with the present invention, since the vent path does not have a linearly extending form like the semiconductor device disclosed in Japanese Patent Application Laid-Open No. 2002-124589 but has a complicated form, the protection effectiveness against entering of water and foreign matter into the hollow portion after the dicing step can be further enhanced and the protection effectiveness against attachment of foreign matter and generation of scars on the surface of the principal plane of the semiconductor element can be further enhanced.

Especially, when a projection wall is provided at the second opening end portion, since the path length of the second opening end portion can be elongated by the length of the projection wall, these protection effectiveness can be enhanced. Furthermore, when a projection wall is provided at the first opening end portion, since the path length of the first opening end portion can be elongated by the length of the projection wall, these protection effectiveness can be further enhanced.

Moreover, with the present invention, since the covering portion is rectangular and the second opening end portion lying on the outer side of the vent path is shaped to be inclined with respect to an edge of the covering portion or shaped to be inclined at an acute angle with respect to a semiconductor wafer movement direction for cutting a semiconductor element from the semiconductor wafer, the protection effectiveness against entering of water and foreign matter into the trap portion after the dicing step can be enhanced.

Moreover, with the present invention, since the bond portion is formed in the form of a rectangular ring, the layout of the bond portion can be designed easily. Moreover, since the vent path is formed along at least one edge of the bond portion, the trap portion can be secured sufficiently.

Moreover, with the present invention, since the covering body or the covering portion is transparent and a photo acceptance element area is provided at the semiconductor element, the device may be applied as a semiconductor device for dealing with optical signals such as a CCD image sensor or a CMOS image sensor. Moreover, since the bond portion is formed at an area which does not block the optical path between the covering portion and the photo acceptance element area, the photo acceptance efficiency of optical signals is not reduced.

Moreover, with the present invention, since the covering portion is smaller than the semiconductor element, the total volume of the semiconductor device can be reduced and miniaturization of the semiconductor device can be realized.

Moreover, with the present invention, since the bond portion for bonding the semiconductor element with the covering portion includes photosensitive adhesive, a bond portion having a vent portion, which has an accurate form and is aligned with a high degree of accuracy, provided with a sealing function which is a feature of the present invention can be formed by applying a photolithographic technique. Moreover, a plurality of such bond portions having high pattern accuracy can be formed at one time.

Moreover, with the present invention, since a plurality of semiconductor elements formed on a semiconductor wafer are protected by bonding a plate material/covering portion with the semiconductor elements to be opposed each other, failure due to attachment of foreign matter, generation of scars and the like on the surface of the principal plane of the semiconductor element, especially failure in the dicing step, can be reduced.

In addition, when a plate material provided with a plurality of vent portions formed at the bond portion is divided to form (configure) a plurality of covering portions, a number of covering portions can be formed effectively while eliminating space waste between adjacent bond portions, that is, waste at cutting allowance portion of the plate material by increasing patterning density of the vent portion on the plate material, and the production cost can be reduced.

Furthermore, when a plate material is divided to form a covering portion separately for a plurality of semiconductor elements after bonding the plurality of semiconductor elements with the plate material, bonding of a covering portion with each of a plurality of semiconductor elements can be performed simultaneously using one plate material. That is, since it is possible to simplify alignment of the covering portion (plate material) in comparison with a case of bonding a covering portion with each semiconductor element, the step can be simplified and the production efficiency can be enhanced.

Especially, when a covering portion is provided separately for a plurality of semiconductor elements, since bonding of a covering portion for a semiconductor element which is preliminarily condemned can be omitted, the production efficiency can be enhanced and the production cost can be reduced.

Moreover, since the covering portion (plate material) is bonded via a bond portion having a vent portion formed at a plurality of semiconductor elements in semiconductor wafer state or via a bond portion having a vent portion formed on the plate material, a bond portion having a vent portion at a plurality of semiconductor elements or at a plurality of covering portions can be formed simultaneously and the production efficiency can be enhanced.

Moreover, with the present invention, since the bond portion provided with a plurality of vent paths is attached to dicing tape and the plate material is divided, a plurality of covering portions having a bond portion having less dust can be formed.

Moreover, with the present invention, since the covering portion is formed using a plate material, a covering portion can be formed separately for a plurality of semiconductor elements formed on each semiconductor wafer at one time, using one plate material. Accordingly, the step of bonding the covering portion can be simplified and the production efficiency of the semiconductor device can be enhanced.

Furthermore, with the present invention, since a semiconductor device according to the present invention is incorporated, a reliable module for an optical device capable of realizing easy miniaturization and high portability can be realized.

The above and further objects and features of the invention will more fully be apparent from the following detailed description with accompanying drawings.

DETAILED DESCRIPTION OF THE INVENTION

The following description will explain a semiconductor device of the present invention in detail with reference to the drawings illustrating some embodiments applied to a solid-state imaging device comprising a solid-state imaging element as a semiconductor element.

Embodiment 1

Figure 3A:
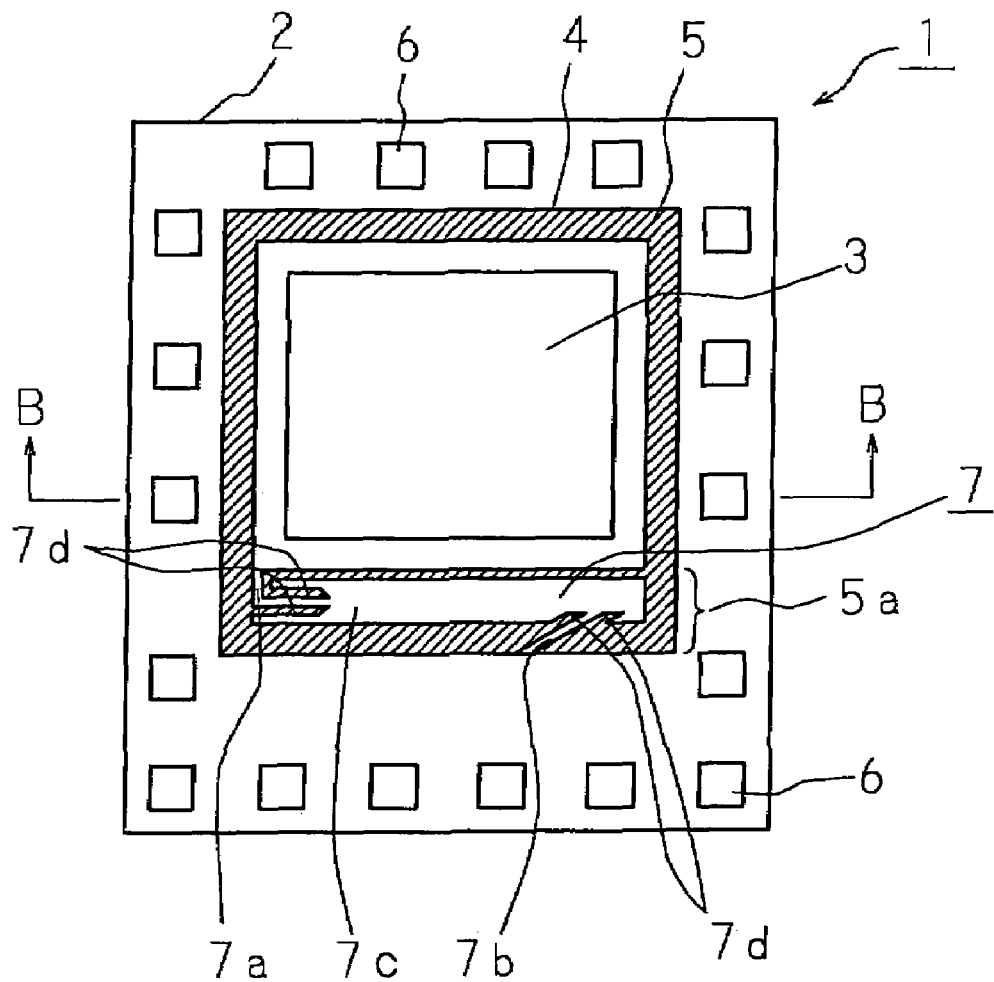
FIGS. 3A and 3B are explanatory views showing the schematic structure of a solid-state imaging device according to Embodiment 1 of the present invention.
Figure 3B:
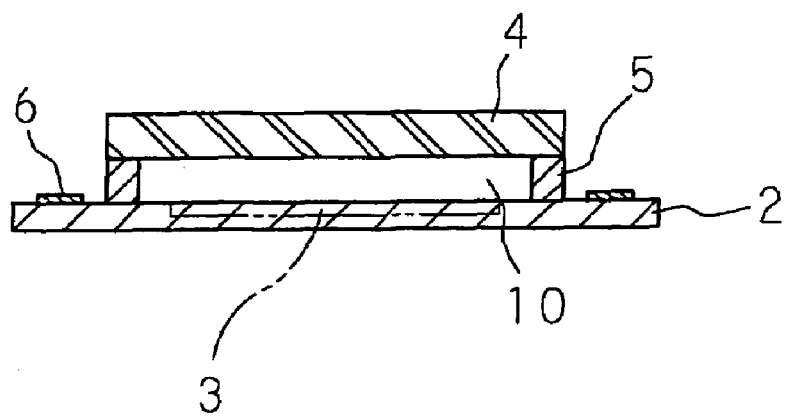

FIGS. 3A and 3B are explanatory views showing the schematic structure of a solid-state imaging device according to Embodiment 1 of the present invention and, in particular, FIG. 3A is a plan view showing the principal plane (one plane) of the solid-state imaging device shown from above and FIG. 3B is a sectional view along the line B-B in FIG. 3A. It should be noted that a bond portion 5 provided with a vent path 7 having a sealing function which is a feature of the present invention is marked by diagonal lines in the following plan view in order to make it understandable.

In FIGS. 3A and 3B, denoted at 1 is a solid-state imaging device and the solid-state imaging device 1 comprises as main components: a solid-state imaging element 2 provided with a semiconductor substrate (for example, silicon monocrystal substrate), which is formed to have a rectangular form on a plane and is provided with a semiconductor circuit; a covering portion 4 made of transparent material (for example, glass) which is arranged opposite to cover at least an effective pixel area 3, which is formed at a center portion of the principal plane of the solid-state imaging element 2 to have a rectangular form on a plane, in order to protect the effective pixel area 3 from outside humidity, dust (contaminant, swarf) and the like; and a bond portion 5 for bonding the solid-state imaging element 2 with the covering portion 4. It should be noted that a covering body for covering the solid-state imaging element 2 is composed of the covering portion 4 and the bond portion 5.

The bond portion 5 is formed around the effective pixel area 3 in the form of a rectangular ring on a plane so as not to block the optical path between the effective pixel area 3 and the covering portion 4 (without interrupting image pickup). When the solid-state imaging element 2 and the covering portion 4 are bonded by the bond portion 5, a hollow portion (space) 10 shown in FIG. 3B is preferably configured between the effective pixel area 3 and the covering portion 4. By configuring the hollow portion 10 between the effective pixel area 3 and the covering portion 4, light from the outside transmitted through the covering portion 4 directly enters the effective pixel area 3 and no light loss is generated in the optical path. The solid-state imaging device 1 takes in light from the outside through the covering portion 4 and receives an optical image with a photo acceptance element arranged at the effective pixel area 3 of the solid-state imaging element 2.

The covering portion 4 protects the effective pixel area 3 from the outside by covering at least the effective pixel area 3 while being opposed to the principal plane of the solid-state imaging device 1. Arranged between the bond portion 5 (covering portion 4) and a peripheral end (chip end) of the principal plane of the solid-state imaging element 2 is a bonding pad 6 which functions as a terminal for connecting the solid-state imaging element 2 with an outer circuit (not illustrated). Miniaturization of the solid-state imaging element 2 is realized since the bonding pad 6 is not covered with the covering portion 4, that is, since the dimension on a plane (size) of the covering portion 4 is smaller than the dimension on a plane (size) of the solid-state imaging element 2.

Regarding the bond portion 5 which is formed around the effective pixel area 3 in the form of a rectangular ring on a plane so as not to block the optical path between the effective pixel area 3 and the covering portion 4, one bonding edge 5a thereof is provided with a first opening end portion 7a on the hollow portion 10 side, a second opening end portion 7b on the outer side and a trap portion 7c. A vent path 7 is composed of these first opening end portion 7a, trap portion 7c and second opening end portion 7b.

The vent path 7 is not shaped to connect the first opening end portion 7a with the second opening end portion 7b linearly but is shaped to connect the opening end portions in the bond portion 5 via the trap portion 7c having a larger form than forms of the opening end portions, so as to enable air communication between the inside of the solid-state imaging device 1 (hollow portion 10) and the outside. Accordingly, humidity deterioration of the solid-state imaging element 2 and dew formation on the inner surface of the covering portion 4 can be prevented even when moisture enters the hollow portion 10 from the outside in the use environment or when moisture is generated at the hollow portion 10. It should be noted that the width of the trap portion 7c, which is formed to cover a length corresponding to most of the bonding edge 5a at a maximum, is larger than the width of the first opening end portion 7a and the second opening end portion 7b as shown in FIG. 3A. Moreover, a wall is formed in the trap portion 7c according to need.

Since the vent path 7 is formed along the bonding edge 5a, the bonding edge 5a is formed to have a larger width than the other three edges of the bond portion 5. Since the bonding edge 5a is provided with the trap portion 7c wider than the first opening end portion 7a and the second opening end portion 7b, the trap portion 7c traps (keeps) water even when water enters the vent path 7 partway from the outside through the second opening end portion 7b in the dicing step.

As a method for further enhancing waterproof effectiveness, the second opening end portion 7b is formed to be inclined with respect to the longitudinal direction of the bonding edge 5a. By forming the second opening end portion 7b to be inclined with respect to the longitudinal direction of the bonding edge 5a and to be inclined at an acute angle with respect to the movement direction of the material of the semiconductor wafer or the covering portion for moving the material of the semiconductor wafer or the covering portion and a dicing saw relatively for dicing, the structure can prevent entering of water through the second opening end portion 7b more reliably than a case where the second opening end portion 7b is formed perpendicularly and not inclined.

Moreover, both of the first opening end portion 7a and the second opening end portion 7b have a projection wall 7d which is projected to the trap portion 7c. Accordingly, the path length of the second opening end portion 7b is elongated by the length of the projection wall 7d, the structure can prevent entering of water from the outside through the second opening end portion 7b in the dicing step more reliably and the structure can prevent water trapped at the trap portion 7c from streaming on the inner wall of the trap portion 7c and arriving at the first opening end portion 7a and prevent water from entering the hollow portion 10 from the trap portion 7c through the first opening end portion 7a even when water enters the trap portion 7c. Furthermore, the cut edge (end) of the projection wall 7d of the first opening end portion 7a may be inclined, so that the structure can prevent water from entering the first opening end portion 7a.

As described above, since the vent path 7 formed at the bond portion 5 is air-permeable and impermeable, it is possible to prevent foreign matter such as swarf generated in the dicing step and water from entering the bond portion 5 and from attaching to the surface of the effective pixel area 3 as dust, and it is possible to prevent generation of scars on the surface of the effective pixel area 3 of the solid-state imaging element 2.

Figure 1:
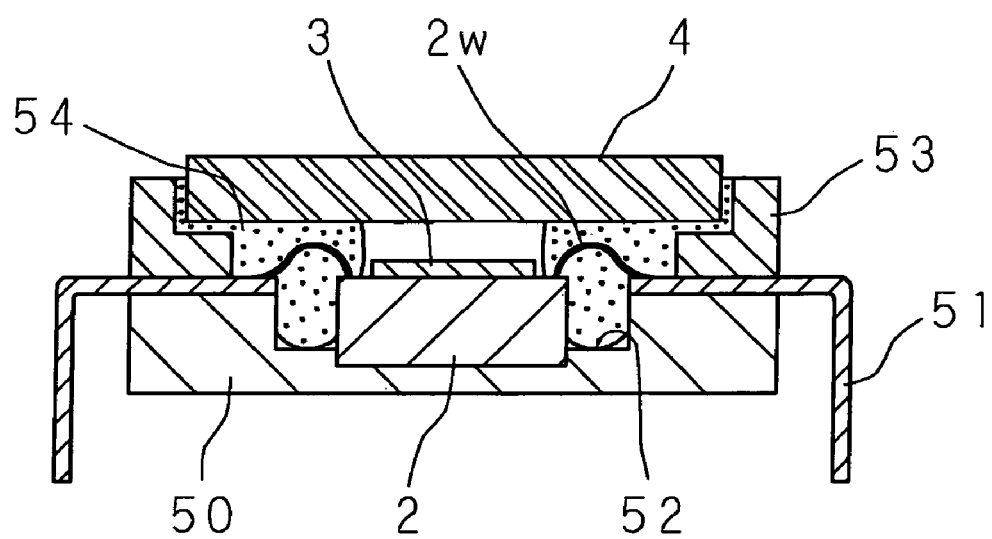
FIG. 1 is a sectional view showing the schematic structure of a conventional solid-state imaging device.
Figure 2A:
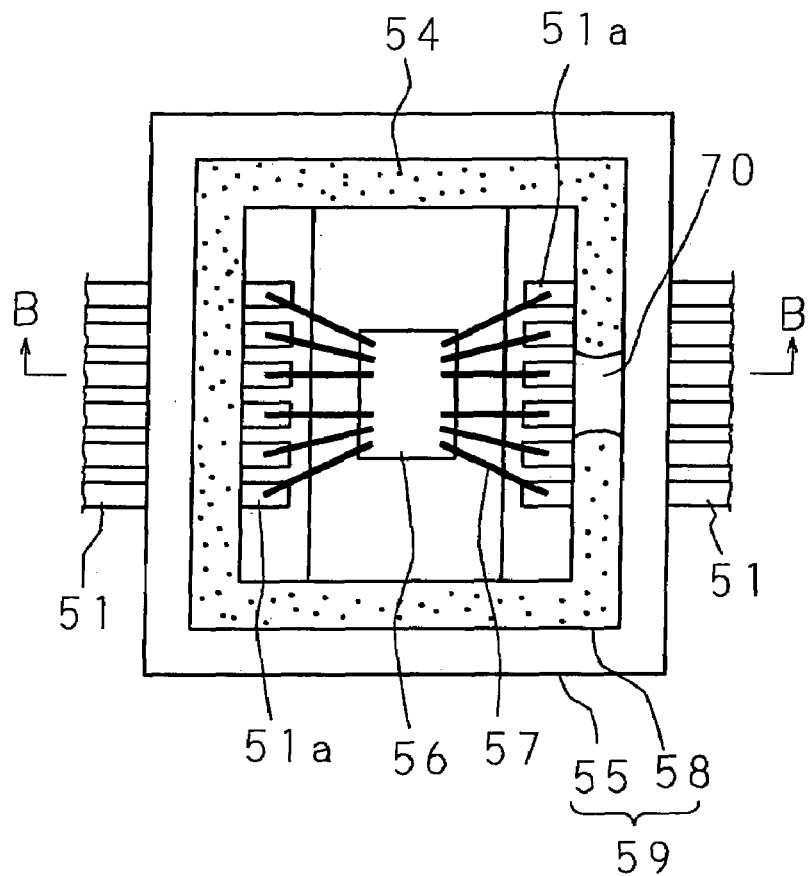
FIGS. 2A and 2B are explanatory views showing the structure of a conventional semiconductor device disclosed in Japanese Patent Application Laid-Open No. 2002-124589.
Figure 2B:
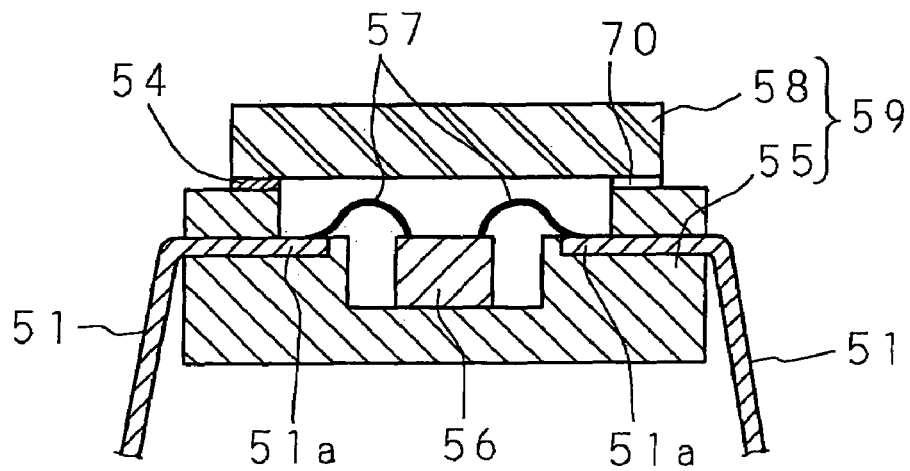

When the vent path 7 has a simple linear structure like conventional one (see the vent path 70 in FIGS. 2A and 2B), even if water and foreign matter such as swarf do not enter the hollow portion 10 while cutting the edge of the semiconductor wafer, pressure is applied to water and foreign matter such as swarf already existing in the middle of the vent path 7 while cutting an adjacent edge or while cutting the semiconductor wafer in a direction perpendicular to the edge, and water and foreign matter such as swarf may enter the hollow portion 10. Moreover, water and foreign matter such as swarf existing in the middle of the vent path 7 may be pressed into the solid-state imaging device 1 (hollow portion 10) by centrifugal force generated while the solid-state imaging device 1 is rotated in the washing step and the drying step after the dicing step.

On the other hand, since the vent path 7 of the solid-state imaging device 1 according to Embodiment 1 of the present invention has the trap portion 7c, even when centrifugal force is applied to water and foreign matter such as swarf, which has entered the vent path partway in the dicing step, in the subsequent washing step and the drying step, water and foreign matter such as swarf are collected to a corner of the trap portion 7c and do not enter the hollow portion 10.

The vent path 7 at the bond portion 5 may have forms shown in FIGS. 4 through 7 instead of the form shown in FIG. 3A. The trap portion 7c of the bond portion 5 shown in FIGS. 4 and 5 has a partition wall 7e for separating the trap portion 7c into a plurality of small trap portions while keeping communication and an opening end portion 7f which keeps communication among the separated small trap portions. Since the trap portion 7c is divided into a plurality of small trap portions, even when water enters the vent path 7 partway, the water stays in each small trap portion and the structure prevents water from moving to the first opening end portion 7a. The opening end portion 7f for keeping communication among the separated small trap portions has a wall projected to the trap portion 7c. Accordingly, even when water enters the vent path 7 partway in steps after the dicing step, the structure prevents water from streaming on the inner wall of the trap portion 7c (small trap portions) and from arriving at the opening end 7f and prevents water from moving from the opening portion 7f to the first opening end portion 7a. Moreover, in the bond portion 5 shown in FIG. 4, the cut edge of the projection wall 7d provided at periphery of the opening end of the first opening end portion 7a may be inclined, so that the structure prevents water from entering the first opening end portion 7a.

Figure 6:
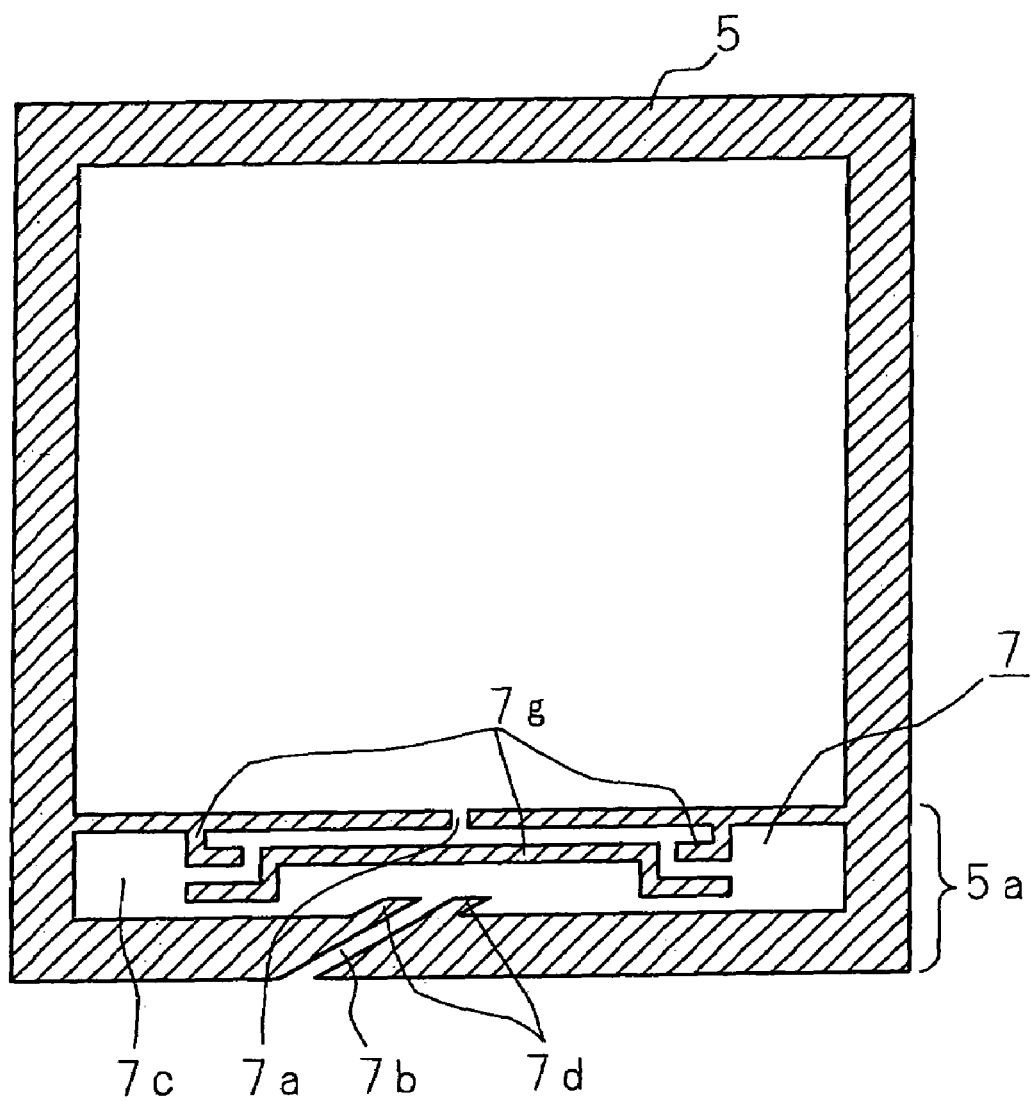
FIG. 6 is an explanatory view showing the schematic structure of a bond portion and a vent path of a solid-state imaging device according to the present invention.

Regarding the bond portion 5 shown in FIG. 6, though the first opening end portion 7a is not provided with a projection wall, a diverting wall 7g for diverting the communication path between the first opening end portion 7a and the second opening end portion 7b is formed separately in the trap portion 7c while keeping communication of the trap portion 7c.

Figure 7:
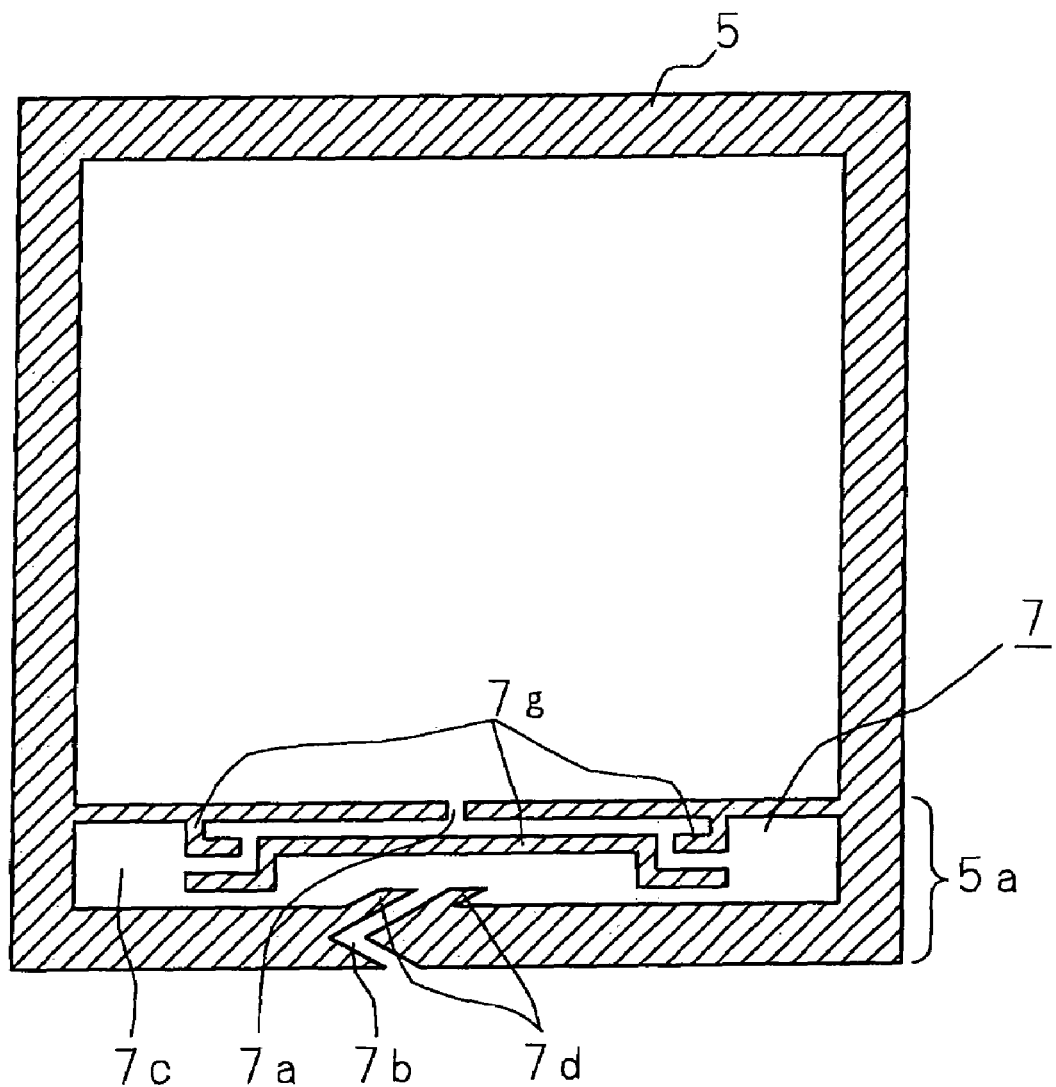
FIG. 7 is an explanatory view showing the schematic structure of a bond portion and a vent path of a solid-state imaging device according to the present invention.

Regarding the bond portion 5 shown in FIG. 7, the second opening end portion 7b of the bond portion 5 shown in FIG. 6 is V-shaped. Accordingly, the second opening end portion 7b which functions as the first entering path of water in the dicing step becomes nonlinear and the structure prevents water from entering the second opening end portion 7b more reliably than a case where the second opening end portion 7b is formed perpendicular to the longitudinal direction of the bonding edge 5a. It should be noted that, though V-shaped second opening end portion 7b is shown, the form is not limited to this and the second opening end portion 7b may be curved such as in U-shape and S-shape.

Figure 4:
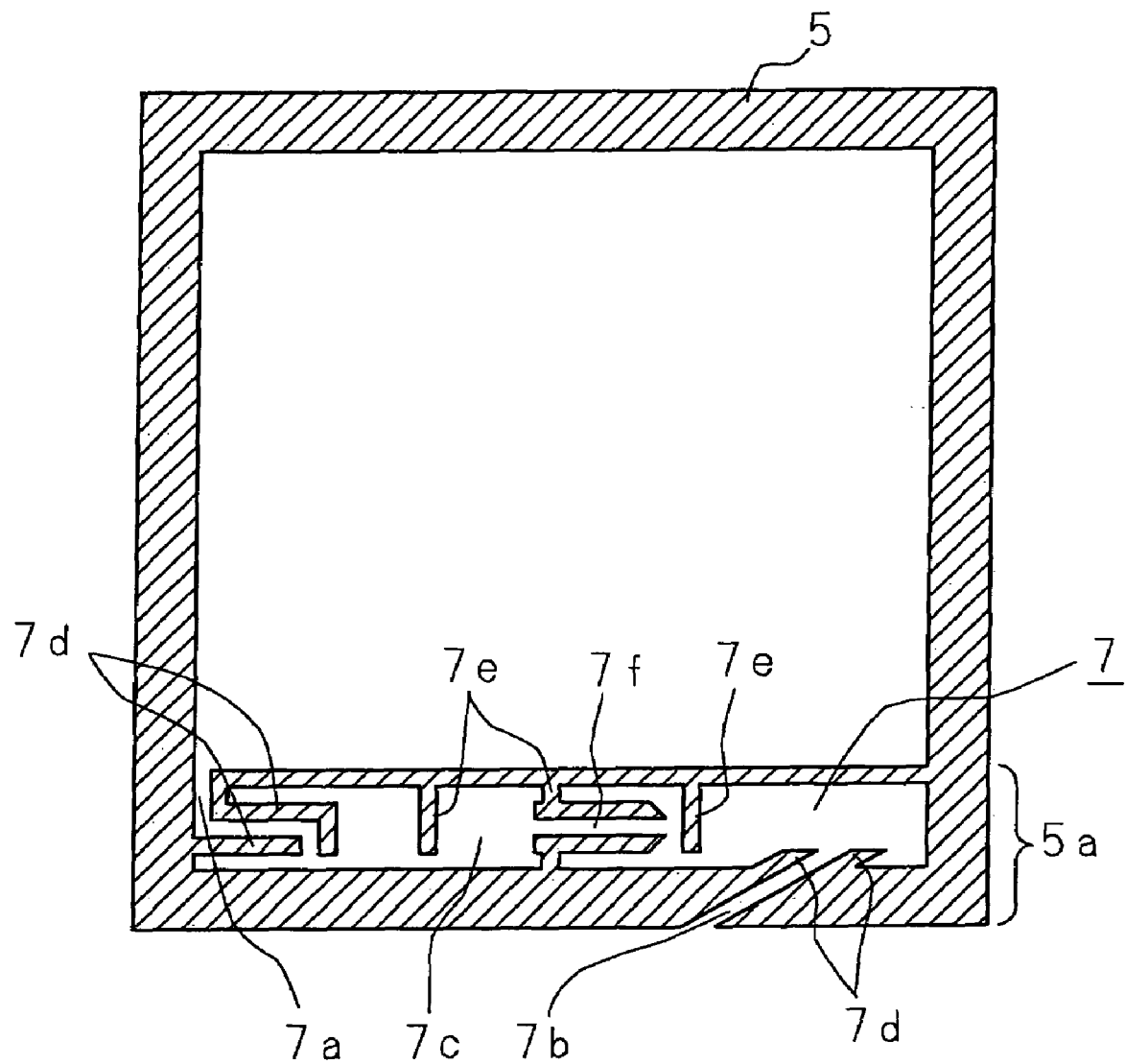
FIG. 4 is an explanatory view showing the schematic structure of a bond portion and a vent path of a solid-state imaging device according to the present invention.
Figure 5:
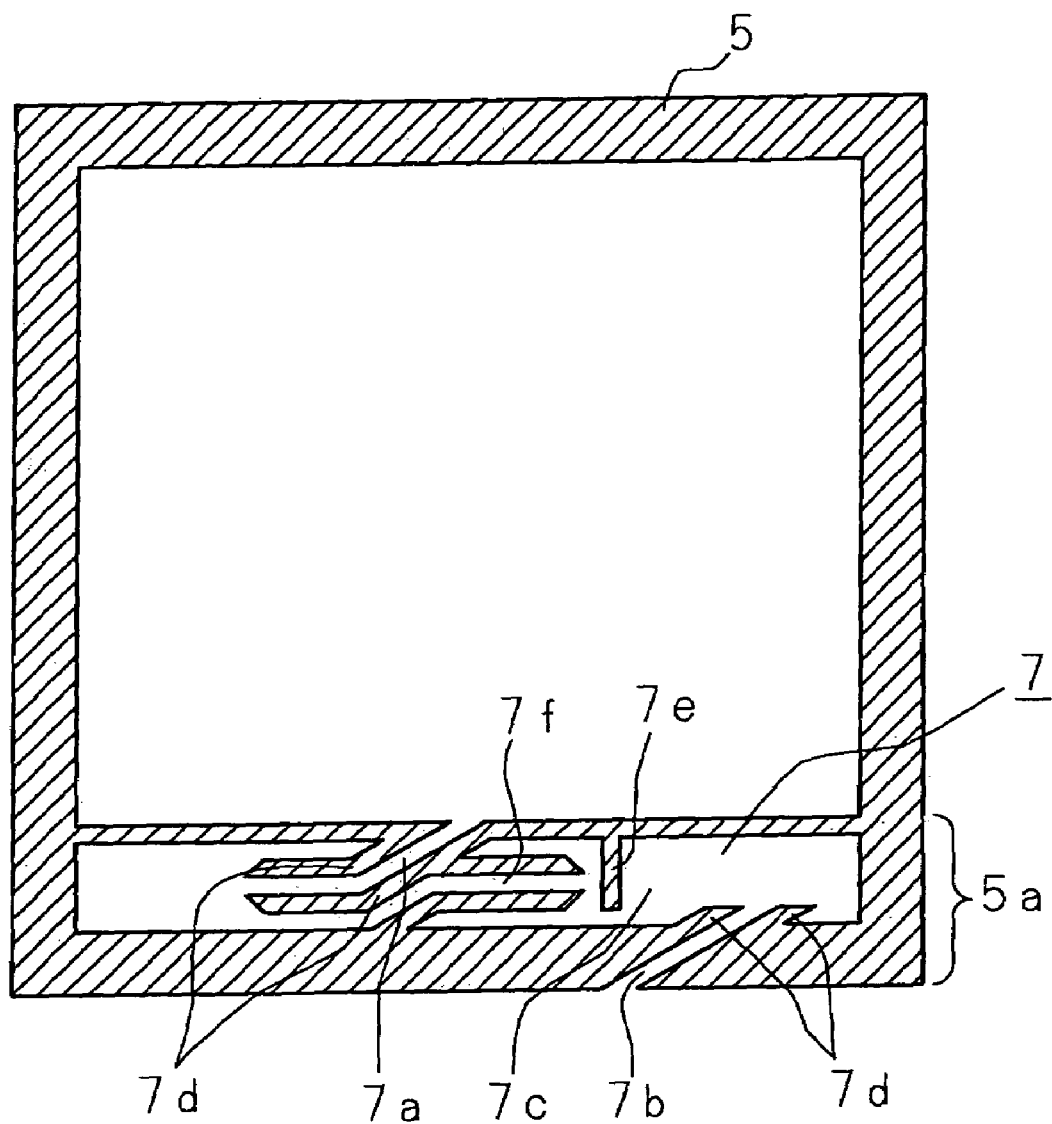
FIG. 5 is an explanatory view showing the schematic structure of a bond portion and a vent path of a solid-state imaging device according to the present invention.

Moreover, the second opening end portions 7b of the bond portions 5 shown in FIGS. 3, 4 and 5 may be V-shaped like the second opening end portion 7b of the bond portion 5 shown in FIG. 7, or may be curved such as in U-shape and S-shape.

The common feature in all the above structures (forms) of the vent paths 7 of the bond portions 5 shown in FIGS. 3A, 4, 5, 6 and 7 is that air communication between the hollow portion 10 and the outside is realized while water is prevented from entering the second opening end portion 7b formed on outer side of the bond portion 5 from the outer side and, even if water enters the second opening end portion 7b partway, water is trapped at middle space (trap portion 7c, small trap portions), which is larger than the first opening end portion 7a and the second opening end portion 7b and covers most of an edge of the bond portion 5, and the first opening end portion 7a formed on the hollow portion 10 side prevents water from discharging to the hollow portion 10.

It should be noted that the form of the vent path 7 of the bond portion 5 of the present invention is not limited to forms illustrated in FIGS. 3A, 4, 5, 6 and 7, and the vent path 7 may have a form other than those illustrated in FIGS. 3A, 4, 5, 6 and 7 as long as the first opening end portion 7a and the second opening end portion 7b are not connected linearly and have a structure (form) to be connected in the bond portion 5 via the trap portion 7c larger than the opening end portions in order to realizing air communication between the inside of the solid-state imaging device 1 and the outside while preventing entering of water and foreign matter such as swarf in the middle of the vent path in steps after the dicing step.

Moreover, though the vent path 7 illustrated in FIGS. 3A, 4, 5, 6 and 7 is preferably formed at one edge (bonding edge 5a) of the bond portion 5 from the standpoint of miniaturization of the solid-state imaging device 1 and the bond area of the bond portion 5, the vent path 7 may be formed over a plurality of edges of the bond portion 5 or a plurality of vent paths 7 may be formed separately at two or more edges.

It should be noted that, when the solid-state imaging device 1 is mounted on an optical device such as a camera or a video recorder camera, the covering portion 4 is required to block infrared ray from the outside as well as to protect the surface of the effective pixel area 3 from dust, scars and the like. In this case, an infrared ray blocking film can be formed easily on the surface of the covering portion 4.

Embodiment 2

Figure 8A:
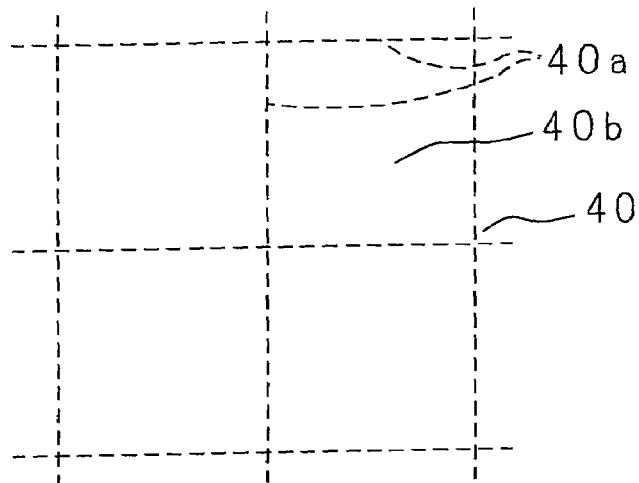
FIGS. 8A through 8E are explanatory views showing a manufacturing method of a solid-state imaging device according to Embodiment 2 of the present invention.
Figure 8B:
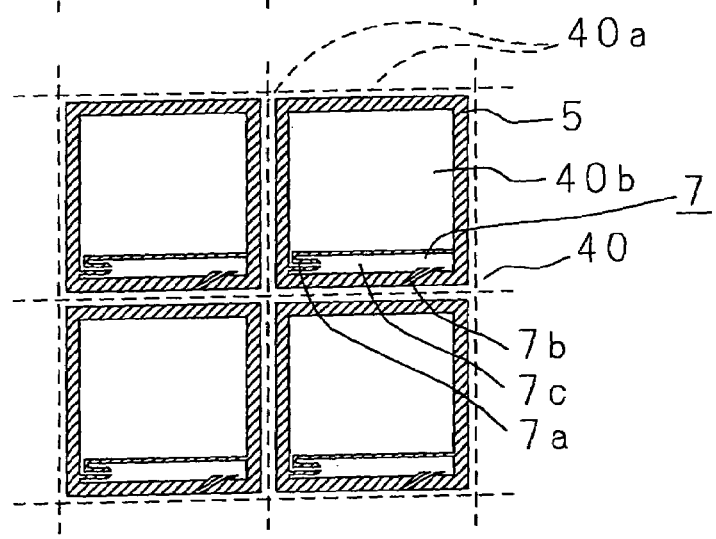
Figure 8C:
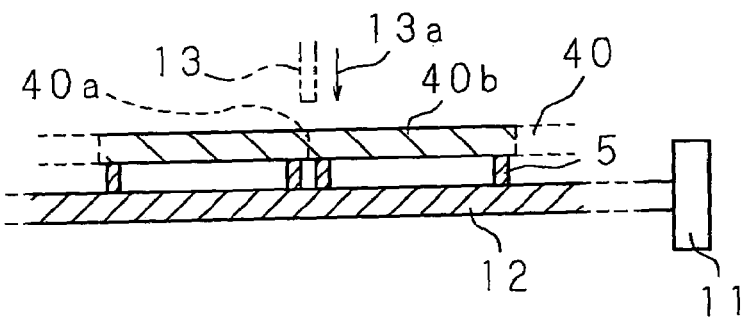
Figure 8D:
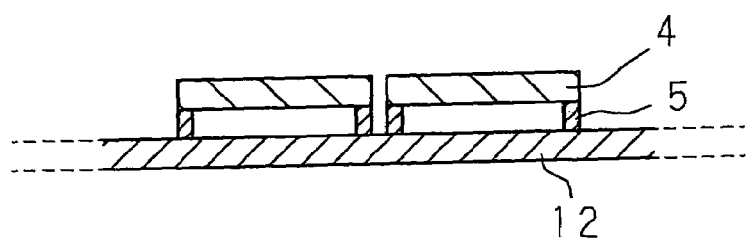
Figure 8E:
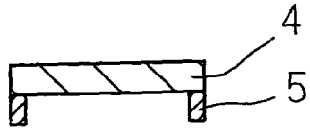
Figure 9A:
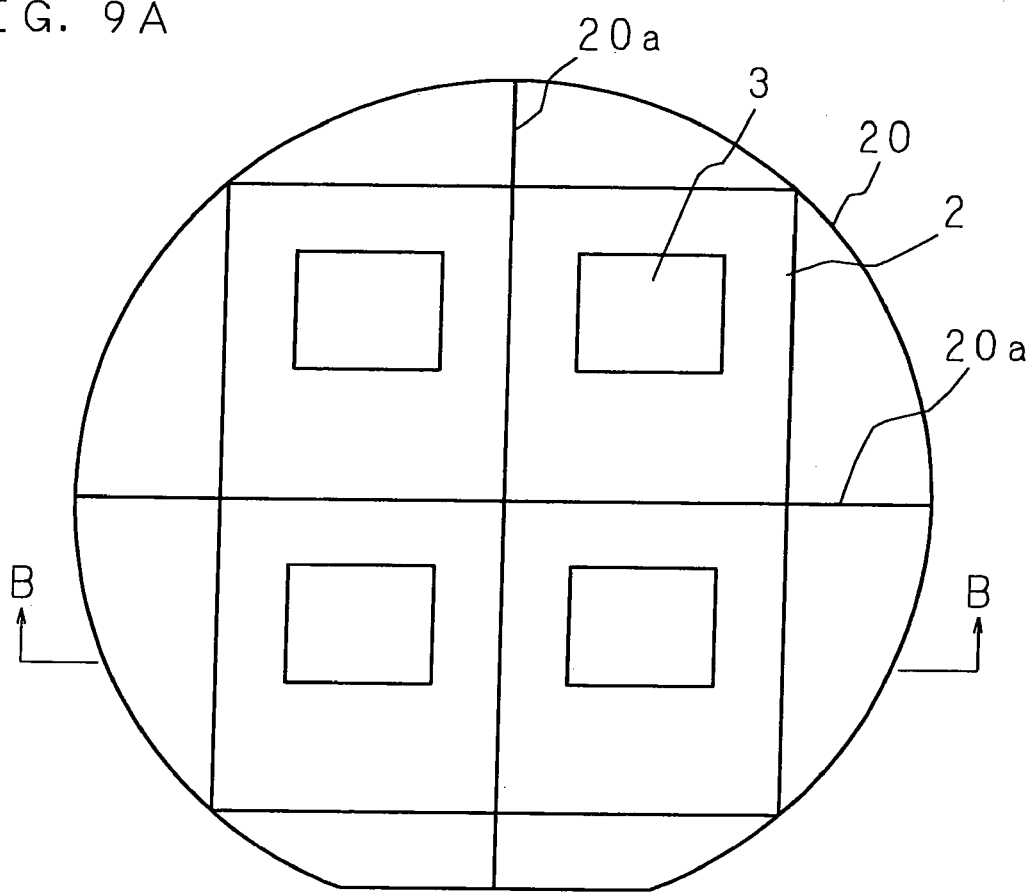
FIGS. 9A and 9B are explanatory views showing a manufacturing method of a solid-state imaging device according to Embodiment 2 of the present invention.
Figure 9B:
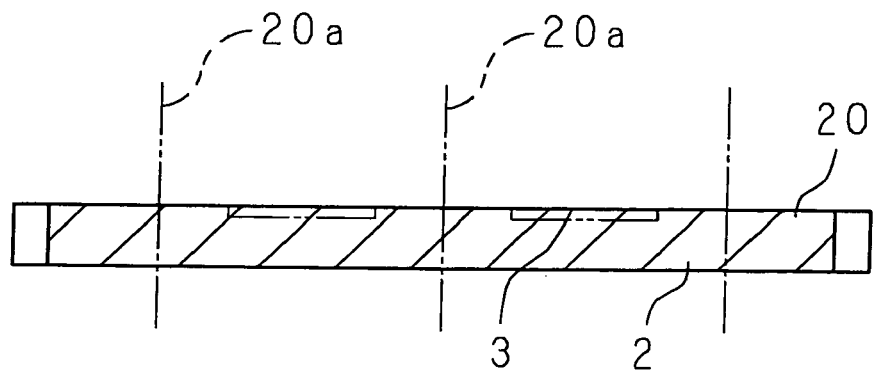
Figure 10A:
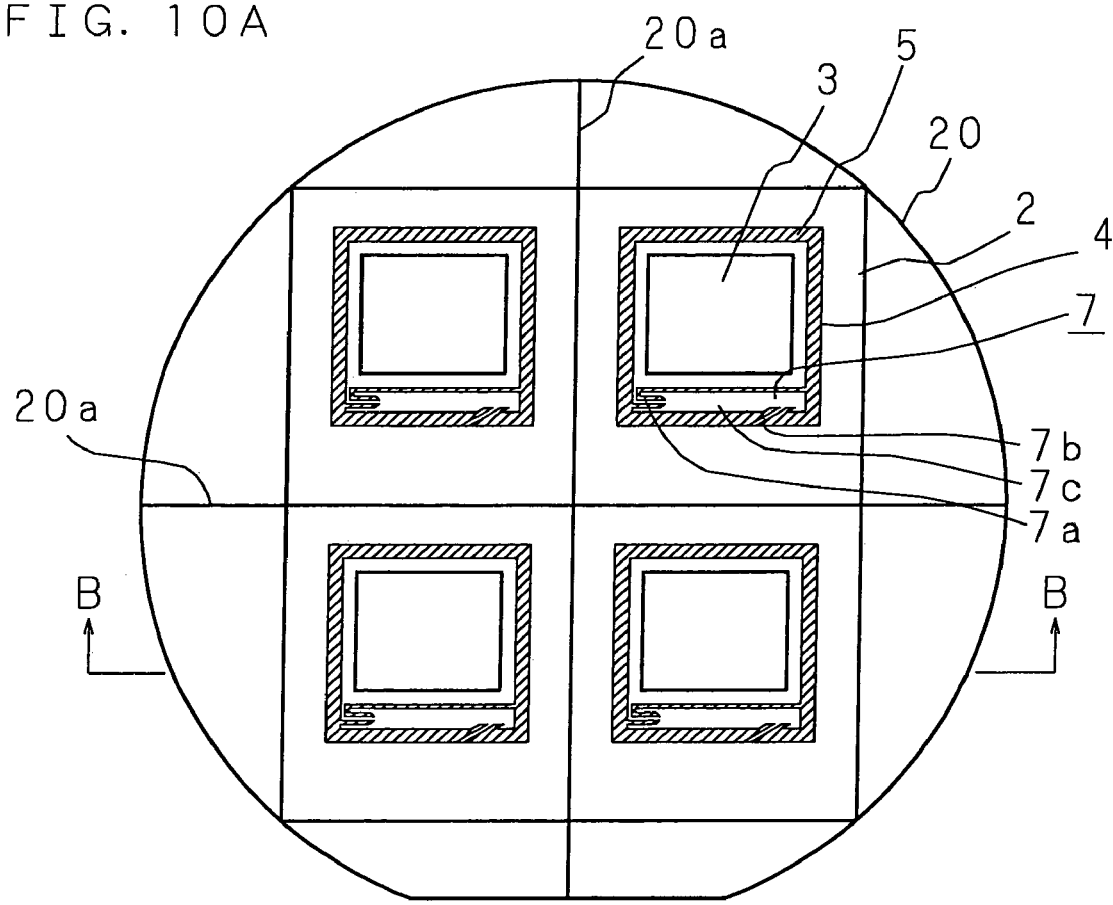
FIGS. 10A and 10B are explanatory views showing a manufacturing method of a solid-state imaging device according to Embodiment 2 of the present invention.
Figure 10B:
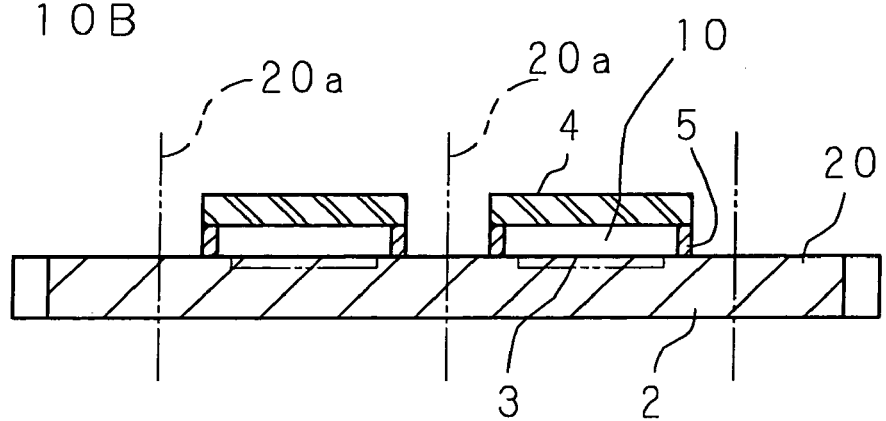

FIGS. 8A through 8E, FIGS. 9A and 9B, and FIGS. 10A and 10B are explanatory views showing a manufacturing method of a solid-state imaging device according to Embodiment 2 of the present invention and, in particular, FIGS. 8A through 8E are explanatory views showing a forming step of a covering portion, FIGS. 9A and 9B are explanatory views showing the status of a solid-state imaging element formed on a semiconductor wafer, and FIGS. 10A and 10B are explanatory views showing the status of a covering portion formed in FIGS. 8A through 8E bonded with the principal plane (surface having an effective pixel area) of the solid-state imaging element in FIGS. 9A and 9B.

FIG. 8A shows a transparent plate material 40 with large area which is made of, for example, a glass plate. The plate material 40 which has a large area includes a plurality of covering portion corresponding areas 40b having parting line 40a as boundary. The area of the covering portion corresponding area 40b is appropriately adjusted to have the same dimension on a plane as the covering portion 4 (see FIGS. 3A and 3B) when divided in the subsequent steps.

FIG. 8B shows a state where a plurality of bond portions 5 are formed simultaneously at the plate material 40. A bond portion 5 lies on one plane on which an effective pixel area 3 of the solid-state imaging element 2 is formed between the effective pixel area 3 and a bonding pad 6 (see FIGS. 3A and 3B) which is a connection terminal to the outside, and patterning of appropriate pattern form is performed on the bond portion 5 to form a vent path 7.

In particular, a plurality of bond portions 5 having a form of the vent path 7 can be formed simultaneously on the plate material 40 by attaching a bonding sheet with uniform thickness made of adhesive composed of photosensitive adhesive (for example, UV cured resin which is acrylic resin) and thermosetting resin (for example, epoxy resin) to the plate material 40 and then performing pattern formation (patterning) using a known photolithographic technique. Since a plurality of bond portions 5 having a form of the vent path 7 are formed simultaneously on the plate material 40, the production efficiency can be enhanced. It should be noted that adhesive may be applied uniformly, for example, by the spin coat method and the vent path 7 may be formed at the bond portion 5 coated with the coating material, instead of attaching a bonding sheet. The same goes for the following embodiments.

The reason of mixing photosensitive adhesive in thermosetting adhesive is that patterning of the bond portion 5 having a form of the vent path 7 can be performed easily and with a high degree of accuracy by performing processes such as light exposure and development by a photolithographic technique in order to provide the adhesive with photosensitivity. Since patterning of the bond portion 5 having a form of the vent path 7 can be performed with a high degree of accuracy, the bond portion 5 having a form of the vent path 7 can be formed with a high degree of accuracy even when an area, on which the bond portion 5 is to be formed, around, and not involving, the effective pixel area 3 on one surface of the solid-state imaging element 2 is narrow.

Moreover, a patterning method of adhesive (for example, epoxy resin or the like) by print processes, a patterning method of adhesive by dispense processes and the like may be used as the patterning method of the bond portion 5 having a form of the vent path 7, and any method which is appropriately selected from methods suitable for the plate material 40, methods suitable for the solid-state imaging device 1, methods suitable for the adhesive and the like according to need may be used.

It should be noted that, though the bond portion 5 in FIG. 8B has the vent path 7 having the same form as that in FIG. 3A, the forms of the vent paths 7 shown in FIGS. 4 through 7 or other forms may be employed as long as the first opening end portion 7a and the second opening end portion 7b are not connected linearly and have a vent path with structure (form) to be connected in the bond portion 5 via the trap portion 7c larger than the opening end portions in order to realize air communication between the inside of the solid-state imaging device 1 and the outside while preventing entering of water and foreign matter such as swarf in steps after the dicing step. The same goes for the following drawings and embodiments.

FIGS. 8C and 8D show a state where a covering portion 4 is formed by dicing the plate material 40 provided with a plurality of patterned bond portions 5 having a form of the vent path 7 at parting line 40a to divide (dissect out) the plate material 40 into separate covering portion corresponding areas 40b. That is, the bond portion 5 formed on the surface of the plate material 40 is attached onto dicing tape 12 fixed to a dicing ring 11 and the plate material 40 is divided into separate covering portions 4 by moving a dicing saw 13 in a dicing direction 13a. Moreover, FIG. 8E shows a state where the covering portion 4 provided with the bond portion 5 having a form of the vent path 7 is released from the dicing tape 12 on appropriate conditions.

In the dicing of the plate material 40, a hollow portion can be formed between the surface of the plate material 40 on which the bond portion 5 is formed and the dicing tape 12 by attaching the bond portion 5 formed on the surface of the plate material 40 to the dicing tape 12. This hollow portion forms space between the covering portion 4 and the dicing tape 12, so that the covering portion 4 does not come in direct contact with the dicing tape 12 and the covering portion 4 is not smeared by the dicing tape. Moreover, since the peripheral portion of the hollow portion is surrounded by the bond portion 5 and the dicing tape 12 and the vent path 7 has a structure to prevent water from entering the space (hollow portion 10) from the outside of the bond portion 5 in the dicing step, dust (such as swarf) generated while dicing the plate material 40 does not attach to the inner surface (plane on which the bond portion 5 having a form of the vent path 7 is formed) of the covering portion 4. That is, when the covering portion 4 is placed on the surface of the effective pixel area 3 of the solid-state imaging element 2 to be opposed each other, it is possible to prevent dust attached to the inner surface of the covering portion 4 from attaching to the surface of the effective pixel area 3 of the solid-state imaging element 2 as dust.

It should be noted that it is not preferable to perform the dicing after attaching the plate material 40 to the dicing tape 12 at the opposite plane to the plane on which the bond portion 5 is formed since the following problems occur. That is, since the inner surface (plane on which the bond portion 5 having a form of the vent path 7 is formed) of the covering portion 4 is left open to the outside, dust (such as swarf) due to dicing attaches to the inner surface of the covering portion 4 and, when the covering portion 4 is placed on the surface of the effective pixel area 3 of the solid-state imaging element 2 to be opposed each other, the dust attached to the inner surface of the covering portion 4 attaches to the surface of the effective pixel area 3 of the solid-state imaging element 2 as dust. Moreover, stain caused by adhesive or the like is formed on the plane of the plate material 40 (covering portion 4) opposite of the plane on which the bond portion 5 is formed due to the adhesive property of the dicing tape 12, causing lowering of the optical transparency and transparency uniformity.

FIG. 9A shows a state where a plurality of solid-state imaging elements 2 are formed simultaneously on the semiconductor wafer 20. A solid-state imaging element 2 has an effective pixel area 3 and each solid-state imaging element 2 is respectively partitioned by parting line 20a. FIG. 9B is a sectional view along the line B-B in FIG. 9A.

FIG. 10A shows a state where the covering portion 4 (see FIG. 8E) preliminarily formed on an appropriate area around the effective pixel area 3 is bonded via the bond portion 5 on the principal plane (plane having the effective pixel area 3) of the solid-state imaging element 2 formed on the semiconductor wafer 20. Each covering portion 4 is bonded using an appropriate method such as infrared-ray irradiation or thermal hardening according to the property of adhesive used for the bond portion 5 after aligning the covering portion 4 appropriately on an area around the effective pixel area 3 on one plane of the solid-state imaging element 2.

FIG. 10B is a sectional view along the line B-B in FIG. 10A. Since the bond portion 5 has a structure to surround the peripheral portion of the hollow portion 10 formed between the effective pixel area 3 and the covering portion 4, it is possible to prevent generation of failure at the effective pixel area 3 due to entering and attachment of dust, scratching and the like. Moreover, by providing the vent path 7 at the bond portion 5, it is possible to discharge moisture which has entered the hollow portion 10 or which is generated at the hollow portion 10 in the use environment to the outside. Since bonding of the covering portion 4 (formation of the bond portion 5) is performed at an area other than the effective pixel area 3, it is possible to eliminate physical stress to the effective pixel area 3.

The solid-state imaging element 2 bonded with the covering portion 4 is diced (divided) appropriately at parting line 20a and separated from the semiconductor wafer 20 to form a solid-state imaging device (1). In the solid-state imaging element 2 bonded with the covering portion 4, since the bond portion 5 used for bonding has the vent path 7 constructed to prevent water from entering the hollow portion 10 from the outside in the dicing step, it is possible to prevent water and foreign matter such as swarf from attaching to the effective pixel area 3 as dust and prevent generation of scars on the surface of the effective pixel area 3.

It should be understood that an area of a bonding pad (not illustrated) for connecting the solid-state imaging element 2 with an outer circuit (not illustrated) or the like is arranged at the outer area of the covering portion 4 (bond portion 5) on the plane on which the effective pixel area 3 is formed. Moreover, since processes of subsequent mounting steps are performed in a state where the effective pixel area 3 is protected, there is no possibility of generation of scars on the effective pixel area 3 even when the solid-state imaging device (1) is transferred by, for example, vacuum contact.

Embodiment 3

Figure 11A:
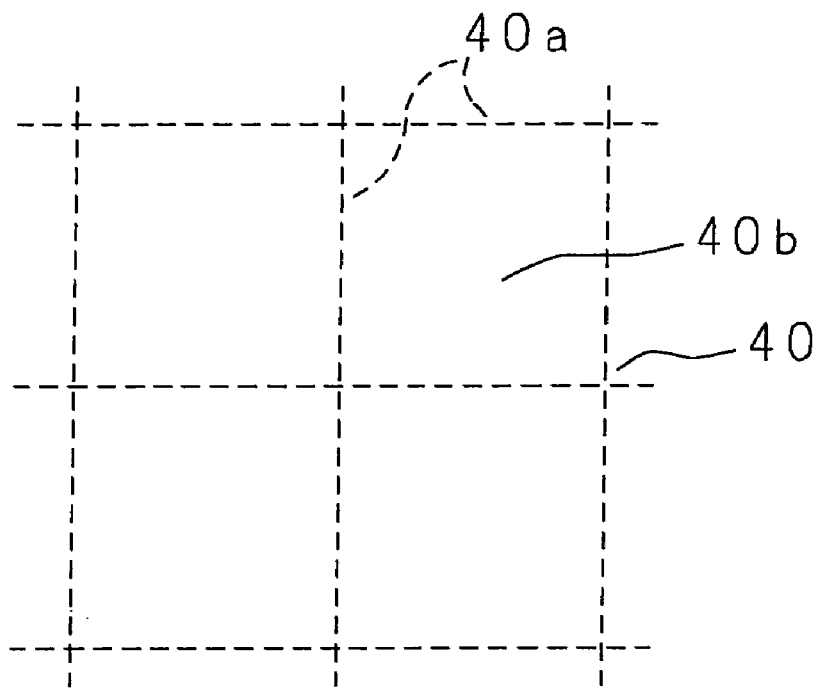
FIGS. 11A and 11B are explanatory views showing a manufacturing method of a solid-state imaging device according to Embodiment 3 of the present invention.
Figure 11B:
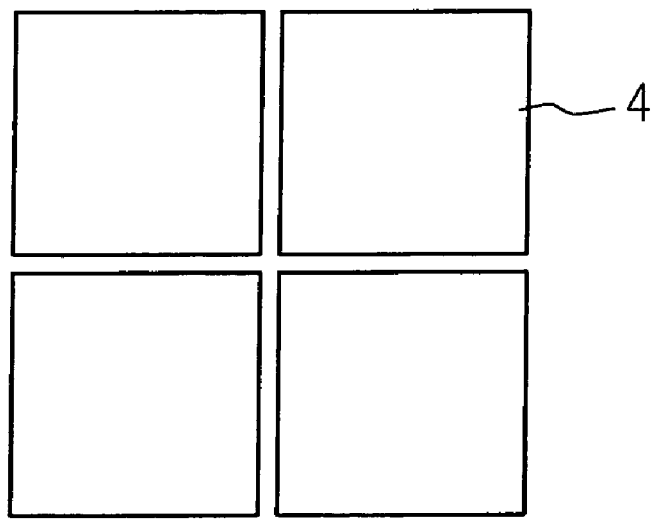
Figure 12A:
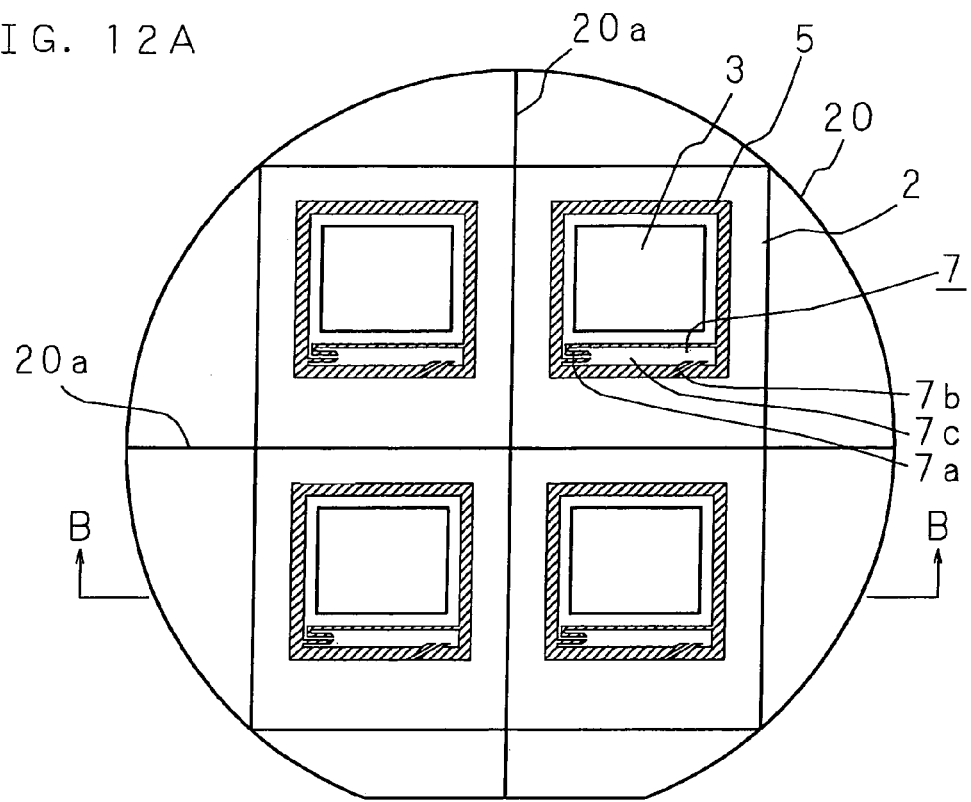
FIGS. 12A through 12C are explanatory views showing a manufacturing method of a solid-state imaging device according to Embodiment 3 of the present invention.
Figure 12B:
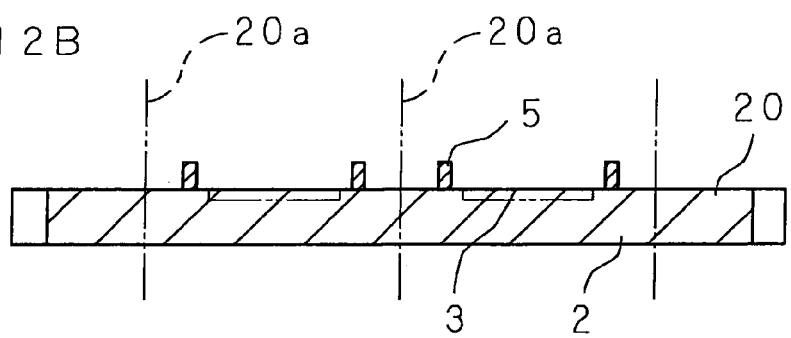
Figure 12C:
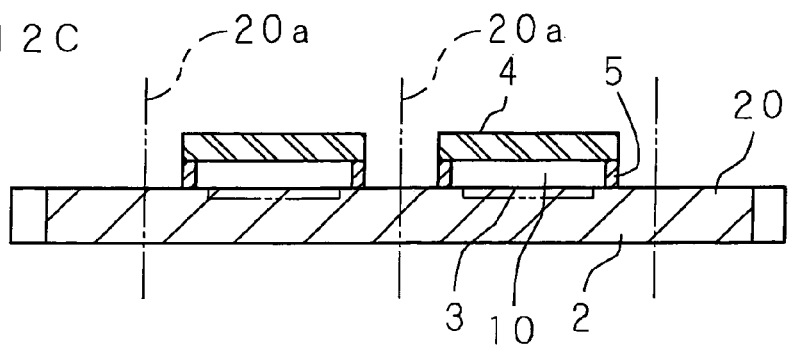

FIGS. 11A and 11B, and FIGS. 12A through 12C are explanatory views showing a manufacturing method of a solid-state imaging device according to Embodiment 3 of the present invention and, in particular, FIGS. 11A and 11B are explanatory views showing a forming step of a covering portion and FIGS. 12A through 12C are explanatory views showing a step of bonding a covering portion formed in FIGS. 11A and 11B with one plane (surface having a effective pixel area) of the solid-state imaging element formed on a semiconductor wafer.

FIG. 11A shows a transparent plate material 40 with large area which is made of, for example, a glass plate. The plate material 40 which has a large area includes a plurality of covering portion corresponding areas 40b having parting line 40a as boundary. The area of the covering portion corresponding area 40b is appropriately adjusted to have the same dimension on a plane as the covering portion 4 when divided in the subsequent steps.

FIG. 11B shows a state where a covering portion 4 is formed by dicing the plate material 40 at the parting line 40a to divide (dissect out) the plate material 40 into separate covering portion corresponding areas 40b. Division can be achieved using a dicing saw similarly to Embodiment 2.

FIG. 12A shows a state where a bond portion 5 having a form of the vent path 7 is patterned at an area around an effective pixel area 3 of each solid-state imaging element 2 on one plane (plane having the effective pixel area 3) of a plurality of solid-state imaging elements 2 formed simultaneously on a semiconductor wafer 20.

FIG. 12B is a sectional view along the line B-B in FIG. 12A. A bond portion 5 having a form of the vent path 7 is formed for each solid-state imaging element 2 by attaching a bonding sheet having a uniform thickness made of adhesive composed of photosensitive adhesive and thermosetting resin to the surface of the semiconductor wafer 20 provided with the solid-state imaging element 2 and patterning the bond portion 5 having a form of the vent path 7 using a known photolithographic technique. That is, in this embodiment, a bond portion 5 having a form of the vent path 7 is formed simultaneously for each of the plurality of solid-state imaging elements 2 formed simultaneously on the semiconductor wafer 20. Since a plurality of bond portions 5 having a form of the vent path 7 are formed simultaneously, the production efficiency can be enhanced. It should be understood that an area of a bonding pad (not illustrated) for connecting the solid-state imaging element 2 with an outer circuit (not illustrated) or the like is arranged at the outer area of the bond portion 5 on the plane on which the effective pixel area 3 is formed.

FIG. 12C shows a state where a preliminarily formed covering portion 4 (see FIG. 11B) is bonded with a bond portion 5 of each solid-state imaging element 2 formed on the semiconductor wafer 20. The covering portion 4 is aligned and laid on the bond portion 5 and then bonded with the bond portion 5 by infrared-ray irradiation or thermal hardening. Since the bond portion 5 is constructed to surround the peripheral portion of the hollow portion 10 formed between the effective pixel area 3 and the covering portion 4, it is possible to prevent generation of failure at the effective pixel area 3 due to entering and attachment of dust, scratching and the like. Moreover, by providing the vent path 7, it is possible to discharge moisture which has entered the hollow portion 10 from the outside or moisture generated at the hollow portion 10 in the use environment to the outside. The solid-state imaging element 2 bonded with the covering portion 4 is diced (divided) appropriately at parting line 20a and separated from the semiconductor wafer 20 to form a solid-state imaging device (1). In the solid-state imaging element 2 bonded with the covering portion 4, since the bond portion 5 used for bonding has the vent path 7 constructed to prevent water from entering the hollow portion 10 from the outside in the dicing step, it is possible to prevent water and foreign matter such as swarf from entering the effective pixel area 3 and from attaching to the surface of the effective pixel area 3.

Embodiment 4

Figure 13A:
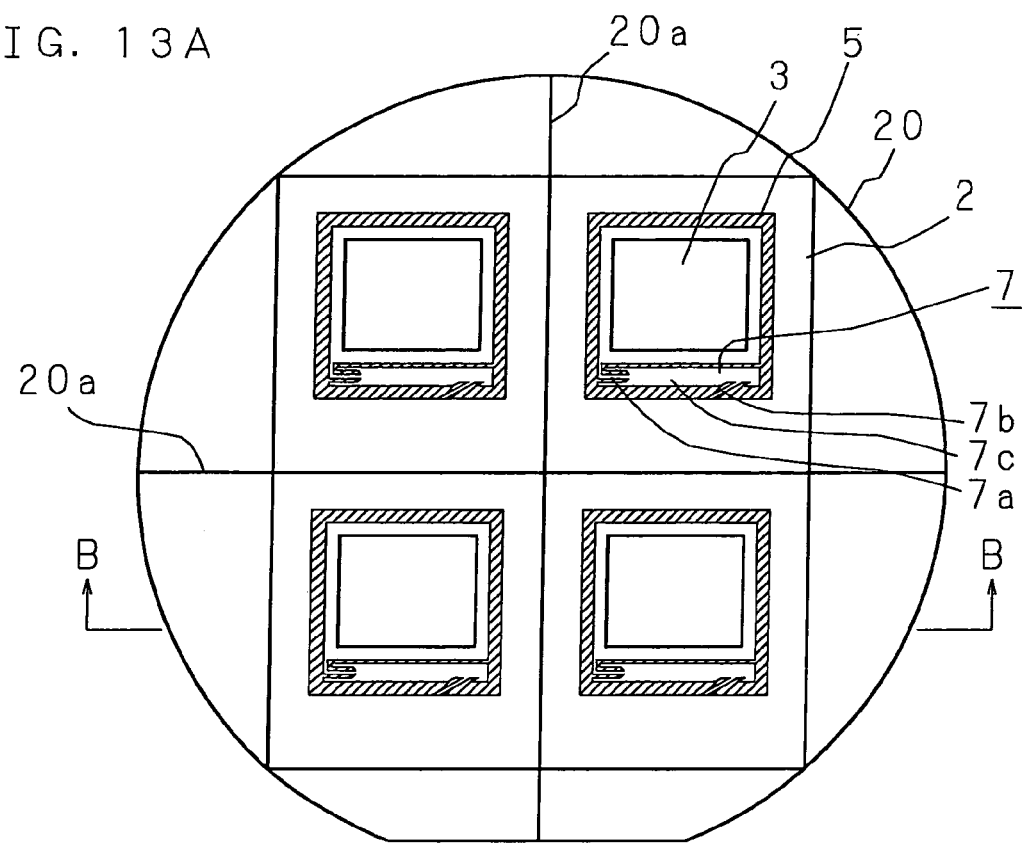
FIGS. 13A and 13B are explanatory views showing a manufacturing method of a solid-state imaging device according to Embodiment 4 of the present invention.
Figure 13B:
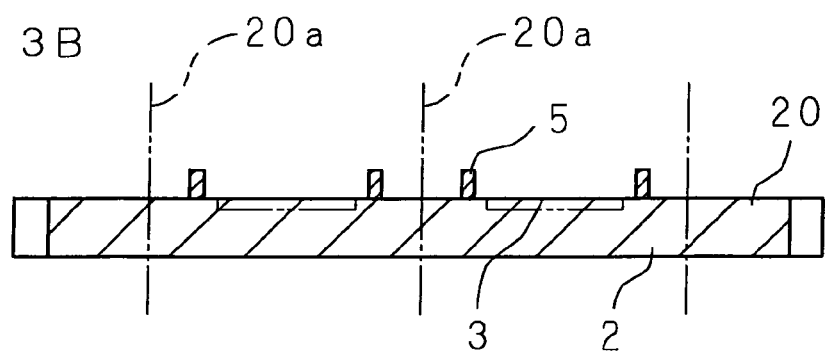
Figure 14A:
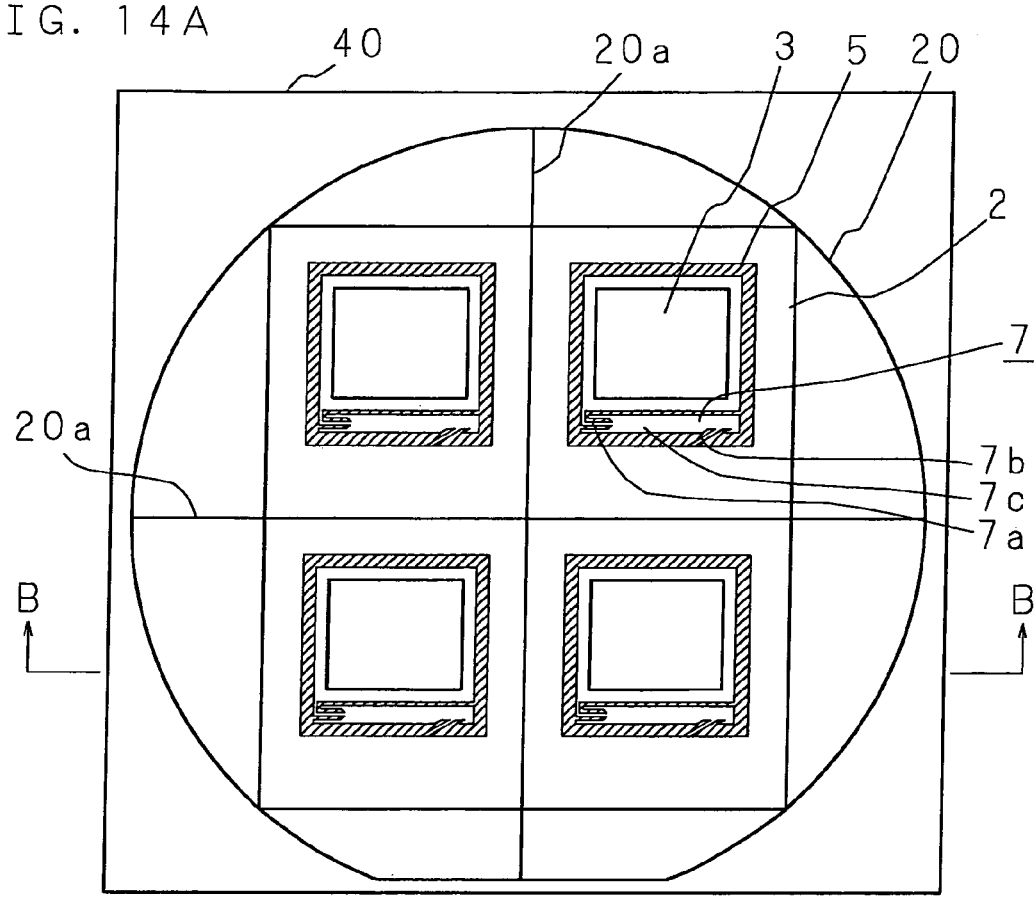
FIGS. 14A through 14C are explanatory views showing a manufacturing method of a solid-state imaging device according to Embodiment 4 of the present invention.
Figure 14B:
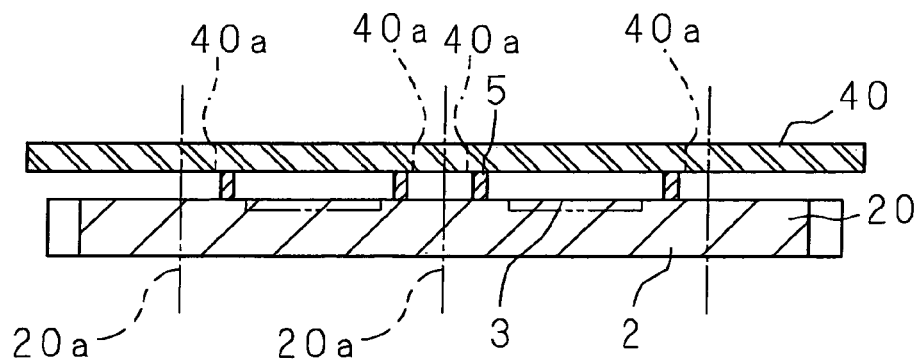
Figure 14C:
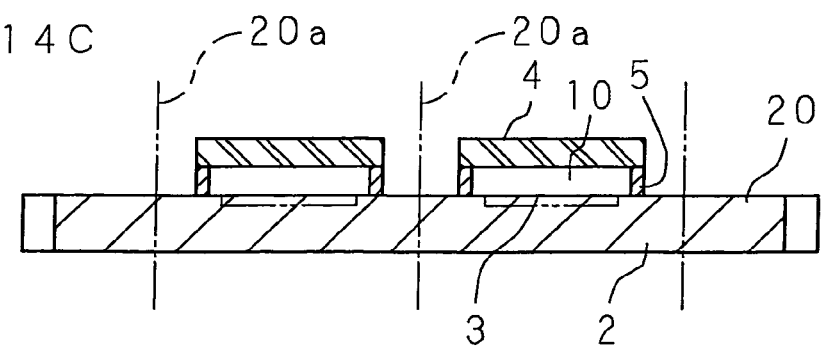

FIGS. 13A and 13B, and FIGS. 14A through 14C are explanatory views showing a manufacturing method of a solid-state imaging device according to Embodiment 4 of the present invention and, in particular, FIGS. 13A and 13B are explanatory views showing a state where a bond portion 5 having a vent path 7 is formed on one plane (surface having an effective pixel area) of a solid-state imaging element formed on a semiconductor wafer and FIGS. 14A through 14C are explanatory views showing a step of dividing a plate material to form a covering portion after bonding the plate material with the semiconductor wafer in FIGS. 13A and 13B.

FIG. 13A shows a state where a bond portion 5 having a form of the vent path 7 is patterned in an area around an effective pixel area 3 of each solid-state imaging element 2 in one plane (plane having the effective pixel area 3) of a plurality of solid-state imaging elements 2 formed simultaneously on the semiconductor wafer 20. FIG. 13B is a sectional view along the line B-B in FIG. 13A. It should be noted that this state is the same as that in FIGS. 12A and 12B of Embodiment 3 and processing conditions such as adhesive are the same as those of other embodiments.

FIG. 14A shows a state where a transparent plate material 40 is bonded with the semiconductor wafer 20 in FIGS. 13A and 13B on which the bond portion 5 having the vent path 7 is formed for each solid-state imaging element 2. The plate material 40 is laid on the bond portion 5 of the semiconductor wafer 20 appropriately and then bonded with the bond portion 5 by infrared-ray irradiation or thermal hardening. Since the bond portion 5 having a form of the vent path 7 is preliminarily formed for each solid-state imaging element 2, it is needless to align the plate material 40 with a high degree of accuracy. Moreover, all that is required is to align the semiconductor wafer 20 and the plate material 40 as a whole, and it is needless to align the plate material 40 for each solid-state imaging element 2.

FIG. 14B is a sectional view along the line B-B in FIG. 14A. Since the plate material 40 is bonded covering the entire semiconductor wafer 20, storage and transportation can be performed with the effective pixel area 3 being protected reliably. Since the bond portion 5 is constructed to surround the peripheral portion of space formed between the effective pixel area 3 and the covering portion 4, it is possible to prevent generation of failure at the effective pixel area 3 due to entering and attachment of dust, scratching and the like. Moreover, by providing the vent path 7, it is possible to discharge moisture which has entered the hollow portion 10 from the outside and moisture generated at the hollow portion 10 in the use environment to the outside.

FIG. 14C is a sectional view showing a state where a covering portion 4 is formed by dicing the plate material 40 bonded with the semiconductor wafer 20 appropriately at parting line 40a shown in FIG. 14B. That is, the semiconductor wafer 20 and the plate material 40 are bonded and then the plate material 40 is divided to form the covering portion 4. The solid-state imaging element 2 bonded with the covering portion 4 is diced (divided) appropriately at the parting line 20a and separated from the semiconductor wafer 20 to form a solid-state imaging device (1). Since the vent path 7 formed at the bond portion 5 of the solid-state imaging element 2 of the present invention is constructed to prevent water from entering the hollow portion 10 from the outside in the dicing step, it is possible to prevent water and foreign matter such as swarf from attaching to the effective pixel area 3 of the solid-state imaging element 2 as dust and prevent generation of scars on the surface of the effective pixel area 3.

Though a method for forming the covering portion 4 by patterning the bond portion 5 having a form of the vent path 7 on the solid-state imaging element 2 (see FIG. 13B), bonding the semiconductor wafer 20 with the plate material 40 and then dicing the plate material 40 has been explained, a method for forming the covering portion 4 by patterning the bond portion 5 having the form of the vent path 7 at the plate material 40 (see FIG. 8B), bonding the semiconductor wafer 20 with the plate material 40 and then dicing the plate material 40 may be employed. In this case, it should be noted that alignment of the bond portion 5 formed at the plate material 40 and the effective pixel area 3 of the solid-state imaging element 2 is performed appropriately.

In Embodiments 2 through 4, since the effective pixel area 3 is constructed to prevent swarf generated while dicing the plate material 40 and the semiconductor wafer 20 (the circumference of the effective pixel area 3 is surrounded by the bond portion 5, a vent path 7 is constructed to prevent water from entering the inside of the solid-state imaging device (hollow portion 10) from the outside in the dicing step or the like) and the covering portion 4 is bonded with and formed on the effective pixel area 3 to be opposed each other before dissecting out the solid-state imaging element 2, it is possible to prevent attachment of dust and generation of scars or the like on the surface of the effective pixel area 3 in the steps after dissecting out the solid-state imaging element 2 and to reduce the fraction defective in mounting steps of the solid-state imaging element 2, especially steps after dissection.

Moreover, by providing the vent path 7, it is possible to prevent humidity deterioration of the solid-state imaging element 2 and dew formation on the inner surface of the covering portion 4 even when moisture enters the hollow portion 10 from the outside or when moisture is generated in the hollow portion 10 in the use environment. Moreover, since the covering portion 4 has a dimension on a plane smaller than that of the solid-state imaging element 2, a solid-state imaging device (1) miniaturized to the level of chip size can be realized. Since it is needless to control the clean level of the circumference (production environment) closely in the steps after bonding the covering portion 4, the steps can be simplified and the production cost can be reduced.

Embodiment 5

Figure 15:
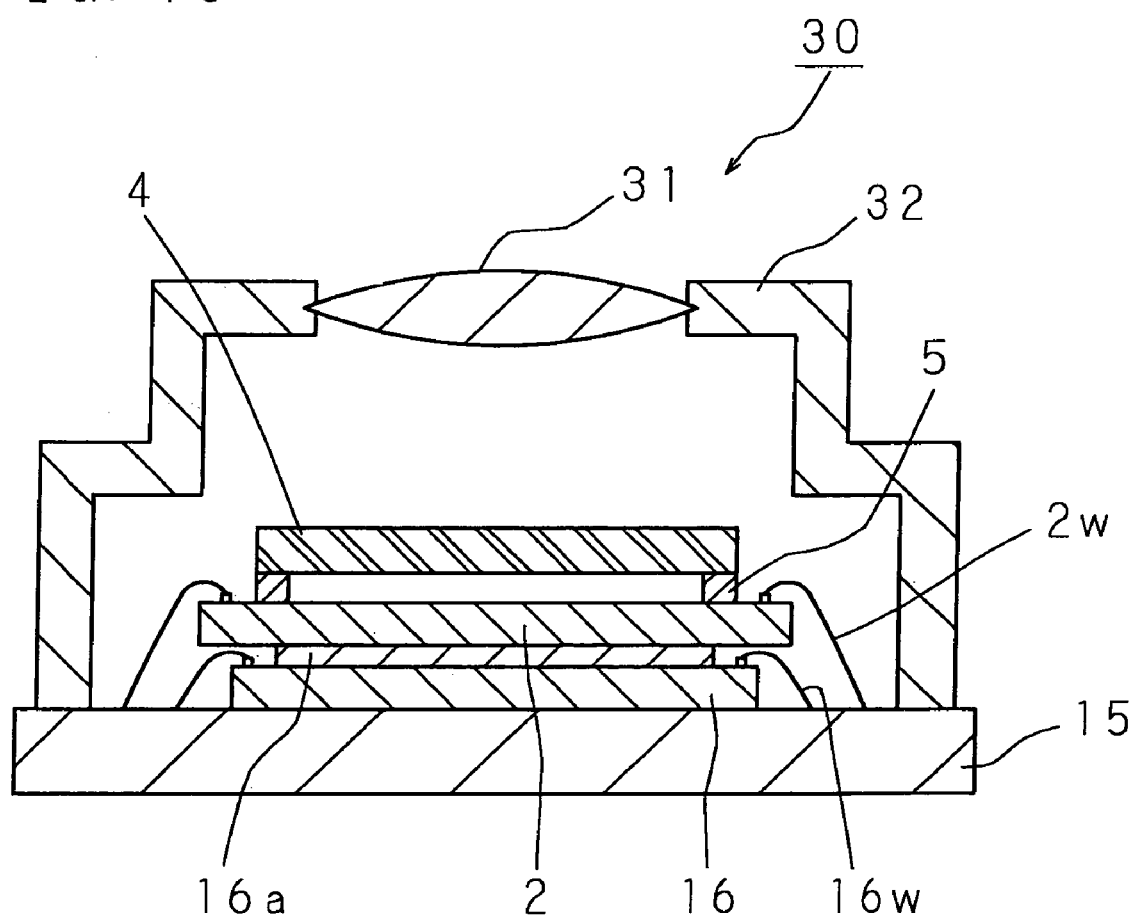
FIG. 15 is a sectional view showing the schematic structure of a module for an optical device according to Embodiment 5 of the present invention.

FIG. 15 is a sectional view showing the schematic structure of a module for an optical device according to Embodiment 5 of the present invention. The module 30 for an optical device is, for example, a camera module, and a lens 31 for taking light from the outside into a wiring substrate 15 and a cylinder (optical path delimiting element) 32 for holding the lens 31 are placed. A digital signal processor (which will be hereinafter referred to as a DSP) 16 is laid on the wiring substrate 15 such as a printed board or ceramics substrate.

The DSP 16 functions as a control unit (image processing device) for controlling operations of a solid-state imaging device (solid-state imaging element 2) and processing a signal outputted from the solid-state imaging device (solid-state imaging element 2) appropriately to generate a signal necessary for an optical device. Wiring (not illustrated) formed on the wiring substrate 15 is wire-bonded and electrically connected with each connection terminal of the DSP 16 using bonding wire 16w.

The solid-state imaging element 2 according to the present invention is laid on the DSP 16 formed as a semiconductor chip via a spacer 16a. Wiring (not illustrated) formed on the wiring substrate 15 is wire-bonded and electrically connected with each connection terminal (bonding pad 6 (see FIGS. 3A and 3B)) of the solid-state imaging element 2 using bonding wire 2w. In the solid-state imaging element 2 according to the present invention, a transparent covering portion 4 is bonded by an air-permeable and impermeable bonding portion 5 (vent path 7 shown in FIGS. 3A, 4, 5, 6 and 7) and the covering portion 4 is arranged be opposed to the lens 31. That is, the solid-state imaging element 2 is arranged inside the cylinder 32.

Since the solid-state imaging element 2 having an effective pixel area protected by the covering portion 4 is mounted on the module 30 for an optical device, dust does not attach to the surface of the effective pixel area of the solid-state imaging element 2 in steps after mounting the solid-state imaging element 2 for manufacturing the module 30 for an optical device and, therefore, manufacturing in a production environment with low clean level is enabled. Accordingly, a module for an optical device and a manufacturing method thereof capable of improvement of yield, simplification of step and price reduction can be realized. It should be noted that the form of the module 30 for an optical device is not limited to that shown in FIG. 15. That is, all that is required is that a solid-state imaging element 2 according to the present invention is mounted on the module 30 for an optical device and, for example, conductive wiring may be formed at the wiring substrate 15 and each connection terminal of the DSP 16 may be connected with the conductive wiring by bonding wire 16w.

Though a solid-state imaging element and a solid-state imaging device are used in Embodiments 1 through 5 described above as an example of a semiconductor element and a semiconductor device, the solid-state imaging element 2 may be any solid-state imaging element such as a CCD, a CMOS or a VMIS image sensor (Threshold Voltage Modulation Image Sensor). Furthermore, the solid-state imaging device may be replaced by a semiconductor laser device, which uses a semiconductor laser element and converts an electric input into light. Moreover, the transparent covering portion 4 may be replaced by a covering portion made of material which is not transparent.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A semiconductor device comprising:
   a semiconductor element;
   a covering body that is secured to a portion of the semiconductor element;
   wherein the covering body is arranged on the semiconductor element so as to cover another portion of the semiconductor element and so a first portion of the covering body is in opposed relation to the another semiconductor element portion;
   wherein a hollow portion is formed between the another semiconductor element portion and the covering body when the covering body is secured to the semiconductor element portion, the covering body including a vent path extending from the hollow portion to the outside; and
   wherein the vent path is water-impermeable.

2. The semiconductor device according to claim 1, wherein:
   the covering body further includes a covering portion for covering the another semiconductor element portion and a bond portion for bonding the semiconductor element portion with the covering portion, and
   the vent path is formed in the bond portion.

3. The semiconductor device according to claim 2, wherein the bond portion is formed in the form of a rectangular ring and the vent path is formed along at least one edge of the bond portion.

4. The semiconductor device according to claim 2, wherein:
   the covering portion is transparent,
   the semiconductor element includes a photo acceptance element area provided with a plurality of arranged photo acceptance elements for converting light transmitted through the covering portion into an electric signal, and
   the semiconductor element portion to which the bond portion is bonded to, is formed in an area of the semiconductor element which does not block an optical path between the covering portion and the photo acceptance element area.

5. The semiconductor device according to claim 2, wherein the covering portion is smaller than the semiconductor element.

6. The semiconductor device according to claim 2, wherein the bond portion includes photosensitive adhesive.

7. The semiconductor device according to claim 1, wherein the vent path has:
   a first opening end portion provided on the hollow portion side;
   a second opening end portion provided on an outer side; and
   a trap portion, which is formed between the first opening end portion and the second opening end portion, where the trap portion is configured so as to be larger than the first opening end portion and the second opening end portion, for trapping water.

8. The semiconductor device according to claim 7, wherein the trap portion has a partition wall.

9. The semiconductor device according to claim 7, wherein the first opening end portion has a projection wall which is projected to the trap portion.

10. The semiconductor device according to claim 7, wherein the second opening end portion has a projection wall which is projected to the trap portion.

11. The semiconductor device according to claim 1, wherein the vent path is nonlinear.

12. The semiconductor device according to claim 1, wherein said first portion of the covering body is transparent and the semiconductor element has a photo acceptance element area provided with a plurality of arranged photo acceptance elements for converting light transmitted through said first portion of the covering body into an electric signal.

13. A module for an optical device, comprising:
   a lens;
   a cylinder for holding the lens; and
   a semiconductor device according to claim 12,
   wherein the covering body of the semiconductor device is arranged inside the cylinder such that said first portion of the covering body is opposed to the lens.

14. A module for an optical device, comprising:
   a lens;
   a cylinder for holding the lens; and
   a semiconductor device according to claim 4,
   wherein the covering portion of the semiconductor device covering body is arranged inside the cylinder such that the covering portion is opposed to the lens.

15. The semiconductor device according to claim 1, wherein:
   the covering body further includes a covering portion for covering the another semiconductor element portion and a bond portion for bonding the semiconductor element portion with the covering portion, and the vent path is formed in the bond portion and includes:
- a first opening end portion provided on the hollow portion side;
- a second opening end portion provided on an outer side; and
- a trap portion, which is formed between the first opening end portion and the second opening end portion, where the trap portion is configured so as to be larger than the first opening end portion and the second opening end portion, for trapping water.

16. The semiconductor device according to claim 15, wherein the covering portion is rectangular and the second opening end portion is inclined with respect to an edge of the covering portion.

17. The semiconductor device according to claim 15, wherein the second opening end portion is formed to be inclined at an acute angle with respect to a semiconductor wafer movement direction for cutting a semiconductor element from a semiconductor wafer.

* * * * *